United States Patent
Omi et al.

(10) Patent No.: US 10,906,141 B2
(45) Date of Patent: Feb. 2, 2021

(54) METHOD FOR MANUFACTURING DEVICE TEMPERATURE CONTROL DEVICE AND METHOD FOR FILLING WORKING FLUID

(71) Applicant: DENSO CORPORATION, Kariya (JP)

(72) Inventors: Yasumitsu Omi, Kariya (JP); Takashi Yamanaka, Kariya (JP); Yoshiki Kato, Kariya (JP); Takeshi Yoshinori, Kariya (JP); Masayuki Takeuchi, Kariya (JP); Koji Miura, Kariya (JP)

(73) Assignee: DENSO CORPORATION, Kariya (JP)

( * ) Notice: Subject to any disclaimer, the term of this patent is extended or adjusted under 35 U.S.C. 154(b) by 35 days.

(21) Appl. No.: 16/293,877

(22) Filed: Mar. 6, 2019

(65) Prior Publication Data
US 2019/0193213 A1 Jun. 27, 2019

Related U.S. Application Data

(63) Continuation of application No. PCT/JP2017/028060, filed on Aug. 2, 2017.

(30) Foreign Application Priority Data

Sep. 9, 2016 (JP) .................. 2016-176791

(51) Int. Cl.
*F28D 15/02* (2006.01)
*B23P 15/26* (2006.01)
*H05K 7/20* (2006.01)
*F25B 1/00* (2006.01)

(52) U.S. Cl.
CPC ................ *B23P 15/26* (2013.01); *F25B 1/00* (2013.01); *F28D 15/02* (2013.01); *F28D 15/0283* (2013.01); *H05K 7/20* (2013.01); *B23P 2700/09* (2013.01)

(58) Field of Classification Search
CPC ....... B23P 15/26; F28D 15/02; F28D 15/0283
See application file for complete search history.

(56) References Cited

U.S. PATENT DOCUMENTS

| 6,216,473 B1 | 4/2001 | Arii |
| 2016/0204488 A1 | 7/2016 | Arai et al. |
| 2019/0184852 A1 | 6/2019 | Takeuchi et al. |

(Continued)

FOREIGN PATENT DOCUMENTS

| JP | H09042871 A | 2/1997 |
| JP | H11201592 A | 7/1999 |

(Continued)

OTHER PUBLICATIONS

U.S. Appl. No. 16/330,440, filed Mar. 5, 2019, Yoshinori et al.

*Primary Examiner* — Jason L Vaughan
*Assistant Examiner* — Amanda Kreiling
(74) *Attorney, Agent, or Firm* — Harness, Dickey & Pierce, P.L.C.

(57) ABSTRACT

A method for manufacturing a device temperature controller includes filling an inside of a circuit with working fluid by connecting a filling port of the circuit to a container that stores gas phase working fluid. The circuit constitutes a thermosiphon heat pipe and allows the working fluid to circulate in the circuit. In the filling, the working fluid inside the circuit is cooled by a cooling source. An inside temperature of the circuit is decreased to be lower than an inside temperature of the container, and thereby an inside pressure of the circuit is decreased to be lower than an inside pressure of the container.

7 Claims, 12 Drawing Sheets

(56) References Cited

U.S. PATENT DOCUMENTS

| | | |
|---|---|---|
| 2019/0186843 A1 | 6/2019 | Takeuchi et al. |
| 2019/0190102 A1 | 6/2019 | Miura et al. |
| 2019/0198954 A1 | 6/2019 | Miura et al. |
| 2019/0204014 A1 | 7/2019 | Yoshinori et al. |

FOREIGN PATENT DOCUMENTS

| | | |
|---|---|---|
| JP | H11201671 A | 7/1999 |
| JP | 2003329380 A | 11/2003 |
| JP | 2015041418 A | 3/2015 |
| WO | WO-2018047528 A1 | 3/2018 |
| WO | WO-2018047529 A1 | 3/2018 |
| WO | WO-2018047530 A1 | 3/2018 |
| WO | WO-2018047531 A1 | 3/2018 |
| WO | WO-2018047532 A1 | 3/2018 |
| WO | WO-2018047533 A1 | 3/2018 |
| WO | WO-2018047534 A1 | 3/2018 |
| WO | WO-2018047535 A1 | 3/2018 |
| WO | WO-2018047537 A1 | 3/2018 |
| WO | WO-2018047538 A1 | 3/2018 |
| WO | WO-2018047539 A1 | 3/2018 |
| WO | WO-2018047540 A1 | 3/2018 |

US 10,906,141 B2

METHOD FOR MANUFACTURING DEVICE TEMPERATURE CONTROL DEVICE AND METHOD FOR FILLING WORKING FLUID

CROSS REFERENCE TO RELATED APPLICATIONS

The present application is a continuation application of International Patent Application No. PCT/JP2017/028060 filed on Aug. 2, 2017, which designated the United States and claims the benefit of priority from Japanese Patent Application No. 2016-176791 filed on Sep. 9, 2016. The entire disclosures of all of the above applications are incorporated herein by reference.

TECHNICAL FIELD

The present disclosure relates to a method for manufacturing a device temperature controller that controls a temperature of a device.

BACKGROUND

A temperature controller which controls a temperature of a battery mounted on a vehicle is known. A typical temperature controller includes a working fluid circuit which constitutes a loop thermosiphon type heat pipe. The circuit includes an evaporating portion where working fluid evaporates by heat absorption from the battery, and a condensing portion where the working fluid evaporated at the evaporating portion is cooled and condensed.

SUMMARY

A first aspect of the present disclosure is directed to a method for manufacturing a device temperature controller that includes a circuit constituting a thermosiphon type het pipe and allowing working fluid to circulate in the circuit. The circuit includes an evaporating portion in which the working fluid is evaporated by heat absorbed from a device, a condensing portion in which the working fluid evaporated in the evaporating portion is cooled and condensed, and a filling port through which the working fluid is supplied into the circuit. The method includes filling an inside of the circuit with the working fluid by connecting the filling port to a container that stores gas phase working fluid. In the filling, an inside temperature of the circuit is decreased to be lower than an inside temperature of the container by cooling the working fluid inside the circuit using a cooling source, and thereby an inside pressure of the circuit is decreased to be lower than an inside pressure of the container.

EMBODIMENTS

Figure 1:
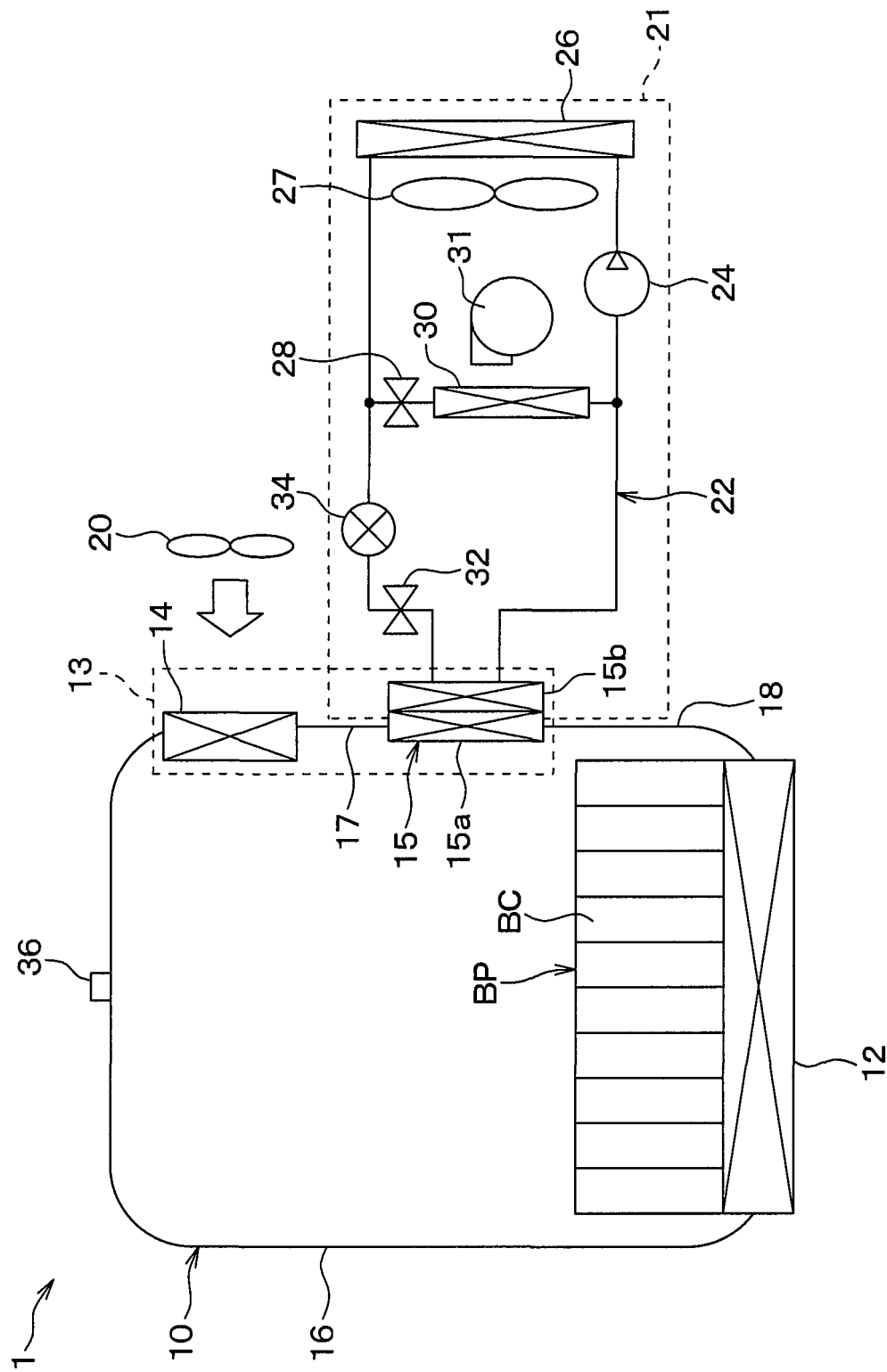
FIG. 1 is a schematic diagram showing a configuration of a device temperature controller according to at least one embodiment of the present disclosure.

Conventional products including a typical wick type heat pipe or thermosiphon type heat pipe are small in size. Accordingly, an inside of a circuit of each conventional product is filled with working fluid before a stage of installation at an installation place.

However, when a typical temperature controller is mounted on a vehicle, the evaporating portion and the condensing portion are disposed at positions away from each other. Filling an inside of a circuit with working fluid before shipping from a manufacturing plant of the temperature controller to a vehicle assembling plant lowers transportation efficiency. Accordingly, this filling method is not practical in view of transportation efficiency. It is therefore necessary to fill the inside of the circuit with working fluid after assembly of each component constituting the circuit to the vehicle at the vehicle assembly plant.

In addition, also during market service at a vehicle repair shop or the like, disassembly and reassembly of the circuit may be needed. In this case, work for recovering working fluid is required at the time of disassembly of the circuit. Work for filling the inside of the circuit with working fluid is required after reassembly of the circuit.

However, a filling method for filling the inside of the circuit with working fluid after assembly of each component constituting the circuit is not known.

Meanwhile, a refrigeration cycle device for a vehicle uses a refrigerant which evaporates at room temperature. Accordingly, for filling the refrigeration cycle device for a vehicle with a refrigerant, gas phase refrigerant is used as the refrigerant in consideration of safety and filling accuracy. In this case, a refrigerant filling port of a refrigerant circuit of the refrigeration cycle device is connected to a container storing the refrigerant. The gas phase refrigerant is introduced into the refrigerant circuit by depressurizing an inside of the refrigerant circuit. The inside of the refrigerant circuit is further depressurized by operating a compressor. In this manner, an inside pressure of the refrigerant circuit is made lower than an inside pressure of the container. The inside of the refrigerant circuit is filled with a predetermined amount of the refrigerant by utilizing a pressure difference between the refrigerant circuit and the container.

However, in the temperature controller that does not include a compressor, the pressure inside the circuit is difficult to reduce, wherefore the inside of the circuit is difficult to fill with the predetermined amount of working fluid. In addition, the inside of the circuit is difficult to fill with the predetermined amount of working fluid only by depressurizing the inside of the circuit with a vacuum pump and thereby introducing gas phase working fluid into the circuit.

For example, working fluid can be filled by pressurizing working fluid in the container using a special pressurizing device. Alternatively, working fluid can be filled by heating a container to pressurize working fluid. However, it is not desirable to use a special pressurizing device in view of easiness during market service. In addition, heating the container may cause dangers of accidents such as rupture of the container and blowout of the working fluid. Accordingly, heating the container is not preferable in view of safety.

These problems also may arise from a device temperature controller installed at a place other than a vehicle, or controlling a temperature of a device other than a battery. These problems also may arise from a device temperature controller which includes a working fluid circuit constituting a thermosiphon type heat pipe other than a loop type.

Embodiments according to the present disclosure are hereinafter described with reference to the drawings. In the respective embodiments described herein, identical or equivalent parts are given identical reference numbers.

First Embodiment

A device temperature controller 1 of the present embodiment shown in FIG. 1 controls a battery temperature of a battery pack BP, which is a device of a temperature control target, by cooling the battery pack BP mounted on a vehicle. It is assumed that the vehicle on which the device temperature controller 1 is mounted is an electric car or a hybrid car capable of travelling by a not-shown traveling electric motor which includes the battery pack BP as a power source.

The battery pack BP is constituted by a stack which includes a plurality of laminated rectangular parallelepiped battery cells BC. The plurality of battery cells BC constituting the battery pack BP are electrically connected in series. Each of the battery cells BC forming the battery pack BP is constituted by a chargeable and dischargeable secondary battery (e.g., lithium ion battery, lead storage battery). Each of the battery cells BC is not required to have a rectangular parallelepiped shape, but may have other shapes such as a cylindrical shape. Alternatively, the battery pack BP may include the battery cells BC electrically connected in parallel.

The battery pack BP is connected to a not-shown power conversion device and a motor generator. For example, the power conversion device is a device which converts a direct current supplied from the battery pack into an alternating current, and supplies (i.e., discharges) the converted alternating current to various electric loads such as the traveling electric motor. The motor generator is a device which inversely converts traveling energy of the vehicle into electric energy during regeneration of the vehicle, and supplies the inversely converted electric energy to the battery pack BP via an inverter or the like as regenerative power.

The battery pack BP generates self-heat when power is supplied to the traveling vehicle or on other occasions. This heat may increase the temperature of the battery pack BP to an excessively high temperature. When the temperature of the battery pack BP becomes excessively high, not only input/output characteristics of the battery pack BP deteriorate, but also degradation of the battery cells BC develops. Accordingly, a cooling means for maintaining the temperature of the battery pack BP at a predetermined temperature or lower is needed.

In addition, a power storage device including the battery pack BP is often disposed under a floor of the vehicle or under a trunk room. In this case, the battery temperature of the battery pack BP gradually increases not only during traveling of the vehicle but also during parking in summer or in other situations. As a result, the battery temperature may become excessively high. When the battery pack BP is left in a high-temperature environment, the life of the battery considerably shortens with development of degradation. It is therefore demanded to maintain the battery temperature of the battery pack BP at a predetermined temperature or lower even during parking of the vehicle or in other situations.

Furthermore, the development degree of degradation of a plurality of the battery cells BC, which constitute the battery pack BP, is unbalanced when the temperatures of the respective battery cells BC are different. In this case, input/output characteristics of the entire battery pack deteriorate. More specifically, the input/output characteristics of the entire battery pack BP, which includes a series connection body of the battery cells, are determined by battery characteristics of the most degraded battery cell BC in the respective battery cells BC. It is therefore important to equalize the temperatures and reduce the temperature variations of the respective battery cells BC to achieve desired performance of the battery pack BP for a long period.

The cooling means for cooling the battery pack BP is generally constituted by an air cooling type cooling means using a blower, or a cooling means utilizing cold heat of a vapor compression type refrigeration cycle.

However, the air cooling type cooling means using a blower only supplies air or the like within an interior of the vehicle to the battery pack, under which condition cooling capacity sufficient for cooling the battery pack BP may not be obtained.

The cooling means utilizing the cold heat of the refrigeration cycle has excellent capacity for cooling the battery pack BP. However, this cooling means requires operation of a compressor or the like which consumes a large amount of power during parking of the vehicle. In this case, power consumption, noise, and the like may increase, wherefore this cooling means is not preferable.

Accordingly, the device temperature controller 1 adopted in the present embodiment is of a thermosiphon type which controls the battery temperature of the battery pack BP not by forced circulation of a refrigerant by using a compressor, but by natural circulation of working fluid.

The device temperature controller 1 includes a device fluid circuit 10 through which working fluid circulates. The working fluid adopted as fluid circulating in the device fluid circuit 10 is a refrigerant used in a vapor compression type refrigeration cycle (e.g., R134a, R1234yf).

The device fluid circuit 10 is a heat pipe which achieves heat transfer by evaporation and condensation of working fluid, and constitutes a thermosiphon type where the working fluid naturally circulates by gravity. The device fluid circuit 10 also constitutes a loop type where a flow path through which gaseous working fluid flows, and a flow path through which liquid working fluid flows are separated from each other. In other words, the device fluid circuit 10 constitutes a loop thermosiphon type heat pipe.

As shown in FIG. 1, the device fluid circuit 10 is produced by connection between a device heat exchanger 12, a first condenser 14, a second condenser 15, a gas path portion 16, and a liquid path portion 18. The device fluid circuit 10 is a closed annular fluid circuit. A predetermined amount of working fluid is sealed into the device fluid circuit 10.

The device heat exchanger 12 is a heat exchanger which functions as an evaporating portion for absorbing heat from the battery pack BP and evaporating liquid working fluid during cooling of the battery pack BP. The device heat exchanger 12 has a thin flat rectangular parallelepiped shape. The device heat exchanger 12 is disposed at a position facing the bottom surface side of the battery pack BP. In other words, the battery pack BP is disposed on an upper surface of the device heat exchanger 12.

The device heat exchanger 12 is disposed below the first condenser 14 and the second condenser 15. This arrangement allows liquid working fluid to stay in the device fluid circuit 10 at a lower part including the device heat exchanger 12 by gravity.

Each of the first condenser 14 and the second condenser 15 is a heat exchanger which condenses gaseous working fluid evaporated at the device heat exchanger 12. According to the present embodiment, the first condenser 14 and the second condenser 15 constitute a device condensing portion 13 which condenses working fluid. Either the first condenser 14 or the second condenser 15 condenses working fluid. The second condenser 15 is connected to the downstream side of the first condenser 14 via a communication path portion 17. The communication path portion 17 is constituted by piping which contains a flow path through which working fluid flows.

The first condenser 14 is an air-cooling type condenser which cools working fluid by heat exchange between air and working fluid. The device temperature controller 1 includes a blower 20 which supplies air to the first condenser 14.

The second condenser 15 is a condenser which cools working fluid by heat exchange with a refrigerant of a refrigeration cycle device 21 mounted on the vehicle for air conditioning. The refrigeration cycle device 21 constitutes a part of a vehicle air conditioning device. The refrigeration cycle device 21 includes a refrigerant circuit 22 through which a refrigerant circulates.

The second condenser 15 includes a working fluid side heat exchange portion 15a through which working fluid of the device fluid circuit 10 flows, and a refrigerant side heat exchange portion 15b through which a refrigerant of the refrigerant circuit 22 flows. The working fluid side heat exchange portion 15a and the refrigerant side heat exchange portion 15b are thermally connected to each other to achieve heat exchange between the working fluid and the refrigerant.

The refrigerant circuit 22 constitutes a vapor compression type refrigeration cycle. More specifically, the refrigerant circuit 22 is produced by connection between a compressor 24, an air conditioning condenser 26, a first expansion valve 28, an air conditioning evaporator 30, and others by piping. The refrigeration cycle device 21 includes a blower 27 which supplies air to the air conditioning condenser 26, and a blower 31 which forms an air flow toward an interior space of the vehicle.

The compressor 24 compresses and discharges a refrigerant. The air conditioning condenser 26 is a radiator which causes heat release from the refrigerant flowing from the compressor 24 by heat exchange with air to condense the refrigerant. The first expansion valve 28 depressurizes the refrigerant flowing from the air conditioning condenser 26. The air conditioning evaporator 30 evaporates the refrigerant flowing from the first expansion valve 28 by heat exchange with air flowing toward the interior space of the vehicle, and also cools air flowing toward the interior space of the vehicle.

The refrigerant circuit 22 further includes a second expansion valve 32 and the refrigerant side heat exchange portion 15b connected in parallel to the first expansion valve 28 and the air conditioning evaporator 30 in a refrigerant flow. The second expansion valve 32 depressurizes the refrigerant flowing from the air conditioning condenser 26. The refrigerant side heat exchange portion 15b is an evaporating portion where a refrigerant is evaporated by heat exchange with working fluid flowing through the working fluid side heat exchange portion 15a.

The refrigerant circuit 22 further includes an on-off valve 34 which opens and closes a refrigerant flow path through which a refrigerant flows toward the refrigerant side heat exchange portion 15b. By closure of the on-off valve 34, a first refrigerant circuit through which a refrigerant flows in the order of the compressor 24, the air conditioning condenser 26, the first expansion valve 28, and the air conditioning evaporator 30 is produced. By opening of the on-off valve 34, a second refrigerant circuit through which a refrigerant flows in the order of the compressor 24, the air conditioning condenser 26, the second expansion valve 32, and the refrigerant side heat exchange portion 15b is produced in addition to the first refrigerant circuit.

When the outside air temperature or the battery temperature is lower than a predetermined temperature, the blower 20 starts operation. In this case, the refrigeration cycle device 21 is in a stopped state. As a result, the working fluid is cooled and condensed at the first condenser 14 by heat exchange with supplied air.

The on-off valve 34 is opened when both the outside air temperature and the battery temperature are higher than the predetermined temperature. At this time, at least the compressor 24 and the blower 27 start operation. As a result, the working fluid is cooled and condensed at the working fluid side heat exchange portion 15a of the second condenser 15 by heat exchange with the refrigerant flowing through the refrigerant side heat exchange portion 15b. In this manner, the working fluid is cooled at the device condensing portion 13 by the operation of the refrigeration cycle device 21.

The gas path portion 16 guides the gaseous working fluid evaporated at the device heat exchanger 12 to the device condensing portion 13. More specifically, the gas path portion 16 is a first flow path through which the working fluid flows from the device heat exchanger 12 as an evaporating portion to the device condensing portion 13 as a condensing portion. A lower end of the gas path portion 16 is connected to the device heat exchanger 12, while an upper end of the gas path portion 16 is connected to the first condenser 14. The gas path portion 16 of the present embodiment is constituted by piping which contains a flow path through which working fluid flows.

The gas path portion 16 includes a filling port 36 through which working fluid is filled. The filling port 36 may be provided in the device fluid circuit 10 in a portion other than the gas path portion 16. However, it is preferable that the filling port 36 be provided in a portion where gas phase working fluid is present inside the device fluid circuit 10.

The liquid path portion 18 guides liquid working fluid condensed at the device condensing portion 13 to the device heat exchanger 12. More specifically, the liquid path portion 18 is a second flow path through which the working fluid flows from the device condensing portion 13 as the condensing portion toward the device heat exchanger 12 as the evaporating portion. A lower end of the liquid path portion 18 is connected to the device heat exchanger 12, while an upper end of the liquid path portion 18 is connected to the second condenser 15. The liquid path portion 18 of the present embodiment is constituted by piping which contains a flow path through which working fluid flows.

A basic operation of the device temperature controller 1 of the present embodiment will now be described with reference to FIG. 2. An arrow DRg shown in FIG. 2 indicates a direction in which a vertical line extends, that is, a vertical direction.

According to the device temperature controller 1, heat of the battery pack BP transfers to the device heat exchanger 12 when a battery temperature Tb of the battery pack BP increases by generation of self-heat or the like during traveling of the vehicle. A part of working fluid WF, which is liquid, is evaporated at the device heat exchanger 12 by absorbing heat from the battery pack BP. The battery pack BP is cooled by latent heat of evaporation of the working fluid WF which is present inside the device heat exchanger BP. As a result, the temperature of the battery pack BP lowers.

Figure 2:
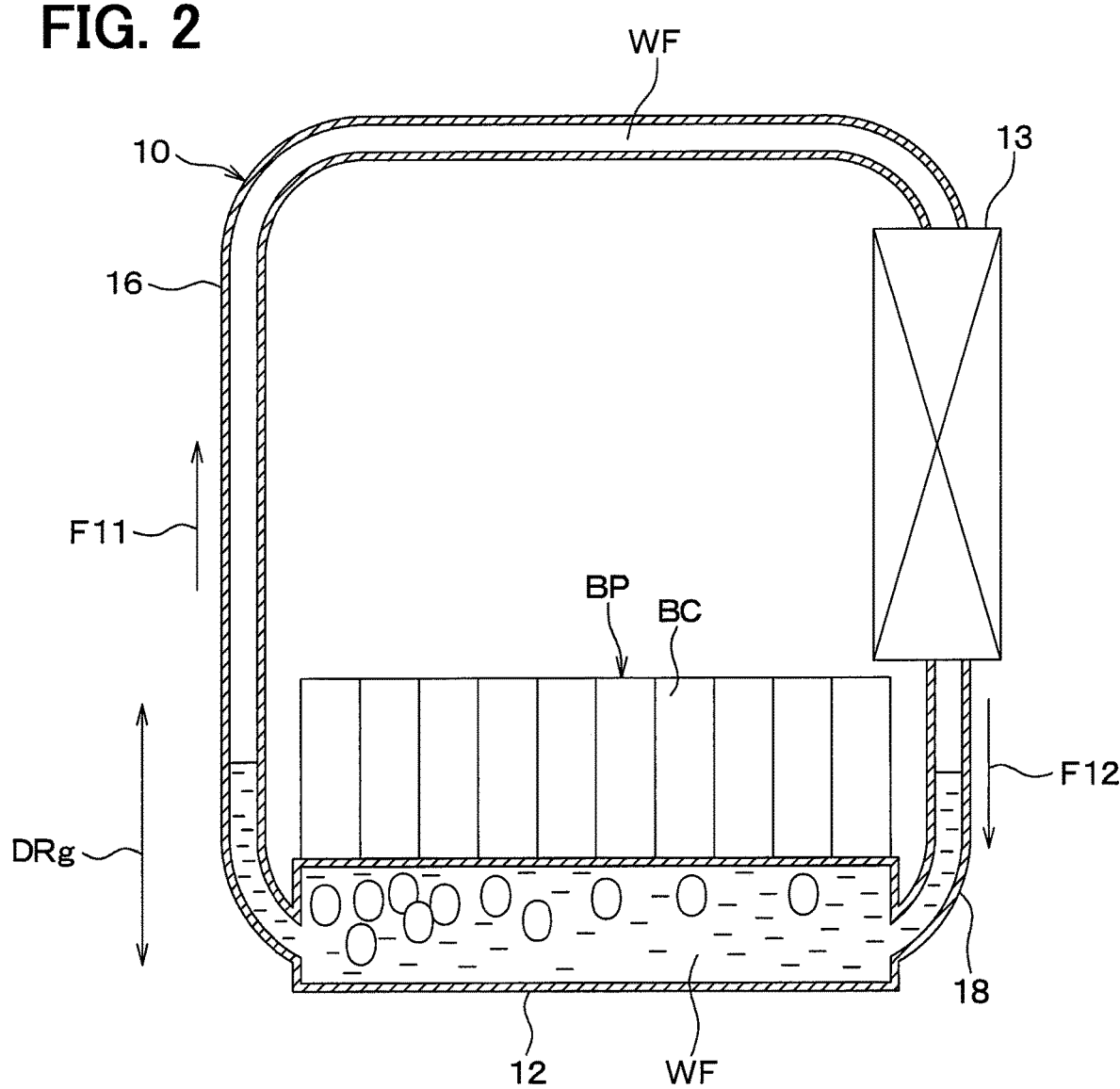
FIG. 2 is a cross-sectional view of a device fluid circuit in FIG. 1.

The working fluid WF evaporated to be gaseous at the device heat exchanger 12 flows from the device heat exchanger 12 to the gas path portion 16, and moves to the device condensing portion 13 via the gas path portion 16 as indicated by an arrow F11 in FIG. 2.

The working fluid WF, which is gaseous, is condensed at the device condensing portion 13 by releasing heat at the first condenser 14 or the second condenser 15. The working fluid WF condensed to be liquid moves downward by gravity. As a result, the working fluid WF condensed to be liquid at the device condensing portion 13 flows from the device condensing portion 13 to the liquid path portion 18, and moves to the device heat exchanger 12 via the liquid path portion 18 as indicated by an arrow F12 in FIG. 2. A part of the working fluid WF which is liquid and introduced into the device heat exchanger 12 is evaporated at the device heat exchanger 12 by heat absorbed from the battery pack BP.

According to the device temperature controller 1, as described above, the working fluid WF circulates between the device heat exchanger 12 and the device condensing portion 13 while changing in phase between the gas state and the liquid state, whereby heat is transported from the device heat exchanger 12 to the device condensing portion 13 to cool the battery pack BP.

The device temperature controller 1 is configured to cause natural circulation of the working fluid WF inside the device fluid circuit 10 even when a driving force required for circulating the working fluid is not produced by a compressor or the like. Accordingly, the device temperature controller 1 can achieve efficient temperature control of the battery pack BP while reducing both power consumption and noise in comparison with a refrigeration cycle or the like.

A method for manufacturing the device temperature controller 1 will now be described.

Figure 3:
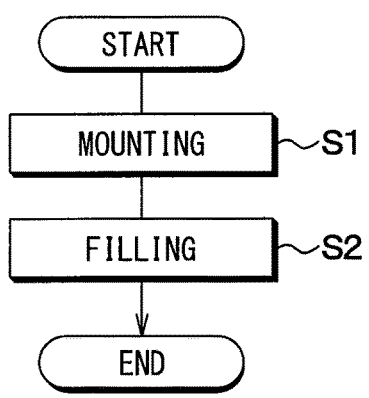
FIG. 3 is a flowchart showing manufacturing steps of the device temperature controller in at least one embodiment.

For mounting the device temperature controller 1 on the vehicle, a mounting step S1 of mounting the device fluid circuit 10 is initially performed, and then a filling step S2 of filling the inside of the device fluid circuit 10 with working fluid is performed at a vehicle assembly plant as shown in FIG. 3. Also during market service, the mounting step S1 of the device fluid circuit 10 is performed after disassembly of the device fluid circuit 10 at a repair shop or the like. After completion of the mounting step S1, the filling step S2 is performed. The filling step S2 performed herein corresponds to a method for filling working fluid.

Figure 4:
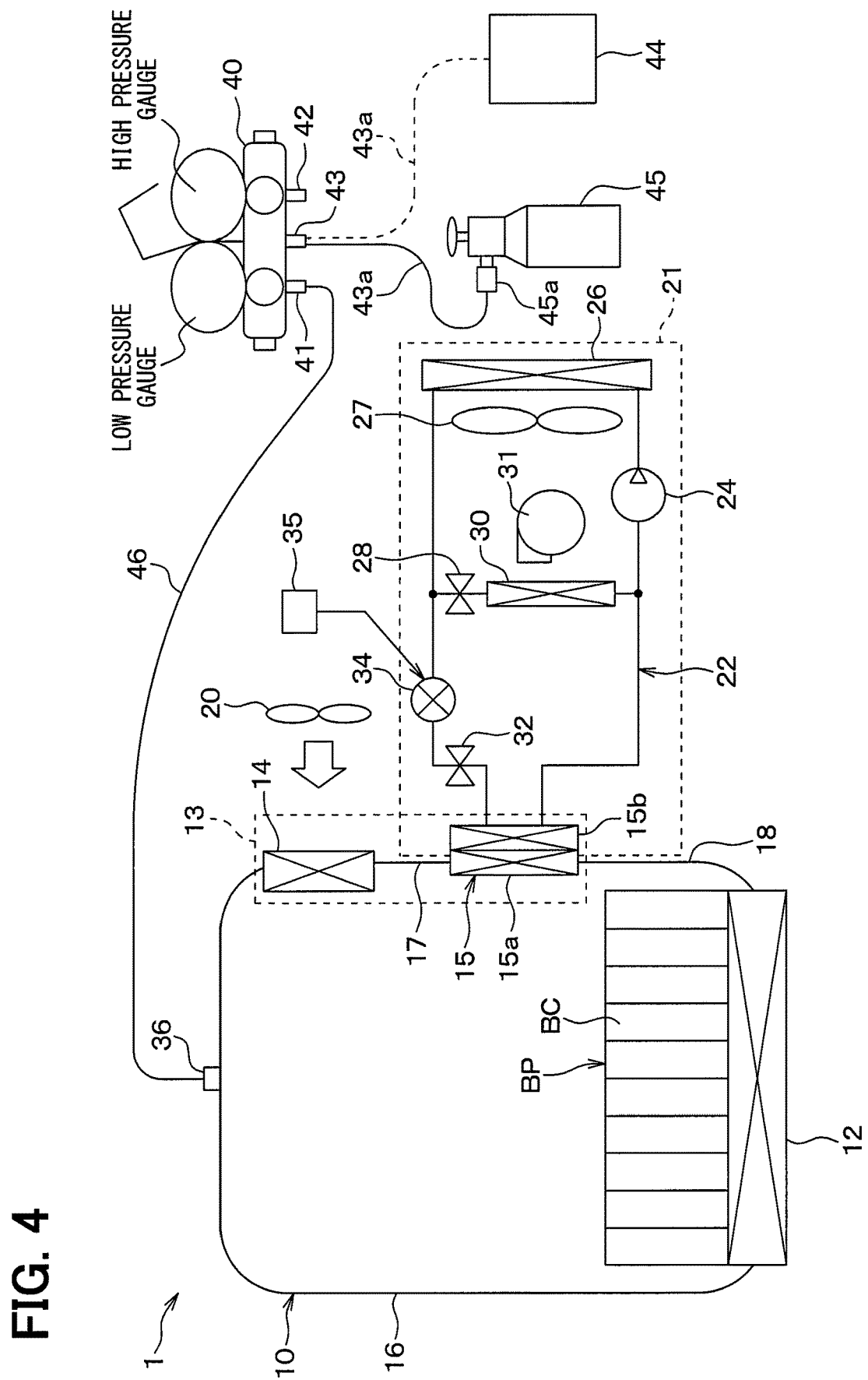
FIG. 4 is a schematic diagram of the device temperature controller in at least one embodiment in a state that a gas canister is connected.

In the mounting step S1, the components 12, 14, 15, 16, 17, 18 of the device fluid circuit 10 are connected to each other while mounted on the vehicle as shown in FIG. 4. As a result, the device fluid circuit 10 before filling of working fluid is produced.

In the filling step S2, the filling port 36 of the device fluid circuit 10 is connected to a gauge manifold 40 as shown in FIG. 4. The gauge manifold 40 is a filling device used for filling an ordinary air conditioning refrigeration cycle device with a refrigerant. The gauge manifold 40 includes a low pressure valve 41, a high pressure valve 42, and a charge valve 43. A vacuum pump 44 or a gas canister 45 is connected to the charge valve 43 via a hose 43a. The gas canister 45 is a container which stores a predetermined amount of a gaseous refrigerant. In the present embodiment, R134a, which is the same type of refrigerant as the type used for the air conditioning refrigeration cycle device 21, is filled as working fluid. Therefore, the gaseous refrigerant described below corresponds to gas phase working fluid. A hose 46 is connected to the low pressure valve 41. The hose 46 is connected to the filling port 36.

As indicated by a broken line in FIG. 4, the hose 43a connected to the charge valve 43 is connected to the vacuum pump 44. This connection achieves connection between the filling port 36 and the vacuum pump 44. Thereafter, the inside of the device fluid circuit 10 is evacuated by the vacuum pump 44. As a result, the inside of the device fluid circuit 10 is depressurized.

Subsequently, in a state that the charge valve 43 is closed, connection between the hose 43a and the charge valve 43 is switched to connection between the hose 43a and the gas canister 45 as indicated by a solid line in FIG. 4. A valve 45a of the gas canister 45 is opened. A not-shown purge valve of the gauge manifold 40 is opened. As a result, air present between the gauge manifold 40 and the gas canister 45 is purged. Thereafter, the charge valve 43 is opened. This opening achieves connection between the filling port 36 and the gas canister 45. A part of the gaseous refrigerant inside the gas canister 45 is sucked into the device fluid circuit 10. At this time, the inside of the device fluid circuit 10 is filled chiefly with the gaseous refrigerant. However, the filling amount of the refrigerant inside the device fluid circuit 10 does not reach a predetermined amount.

Subsequently, a dedicated switch 35 shown in FIG. 4 is operated by an operator to open the on-off valve 34. The dedicated switch 35 is an operation unit manually operated by the operator in the filling step S2. The dedicated switch 35 is an operation unit operated for filling working fluid. As a result, the on-off valve 34 is opened.

A not-shown air conditioner switch is further operated by the operator to operate the refrigeration cycle device 21. As a result, the refrigeration cycle device 21 starts operation. More specifically, the compressor 24, the blower 27, and the like start operation. Accordingly, the gaseous refrigerant inside the device fluid circuit 10 is cooled and condensed at the second condenser 15. This condensation allows further introduction of the refrigerant into the device fluid circuit 10. In addition, the inside temperature of the device fluid circuit 10 becomes lower than the outside air temperature. At this time, the inside temperature of the gas canister 45 is equal to the outside temperature. Therefore, the inside temperature of the device fluid circuit 10 becomes lower than the inside temperature of the gas canister 45.

Figure 5:
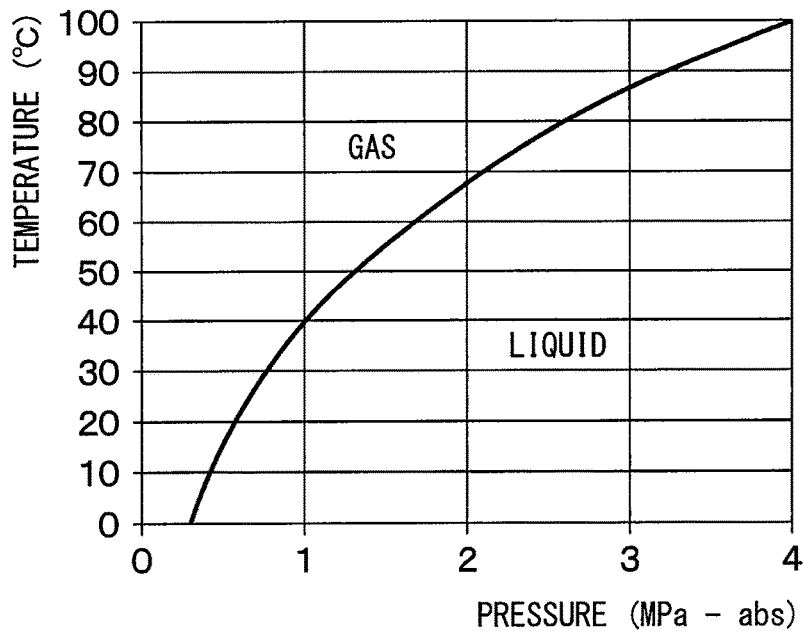
FIG. 5 is a saturation temperature curve of R134a refrigerant.

A saturation temperature curve shown in FIG. 5 indicates a relationship between a temperature of R134a refrigerant and a saturation pressure. As can be seen from the figure, the saturation pressure of the refrigerant decreases as the temperature of the refrigerant lowers. Therefore, the inside temperature of the device fluid circuit 10 becomes lower than the inside temperature of the gas canister 45, wherefore the inside pressure of the device fluid circuit 10 becomes lower than the inside pressure of the gas canister 45.

Accordingly, the gaseous refrigerant inside the gas canister 45 flows into the device fluid circuit 10 by a pressure difference between the inside of the device fluid circuit 10 and the inside of the gas canister 45. The predetermined amount of refrigerant therefore can be filled.

Figure 6:
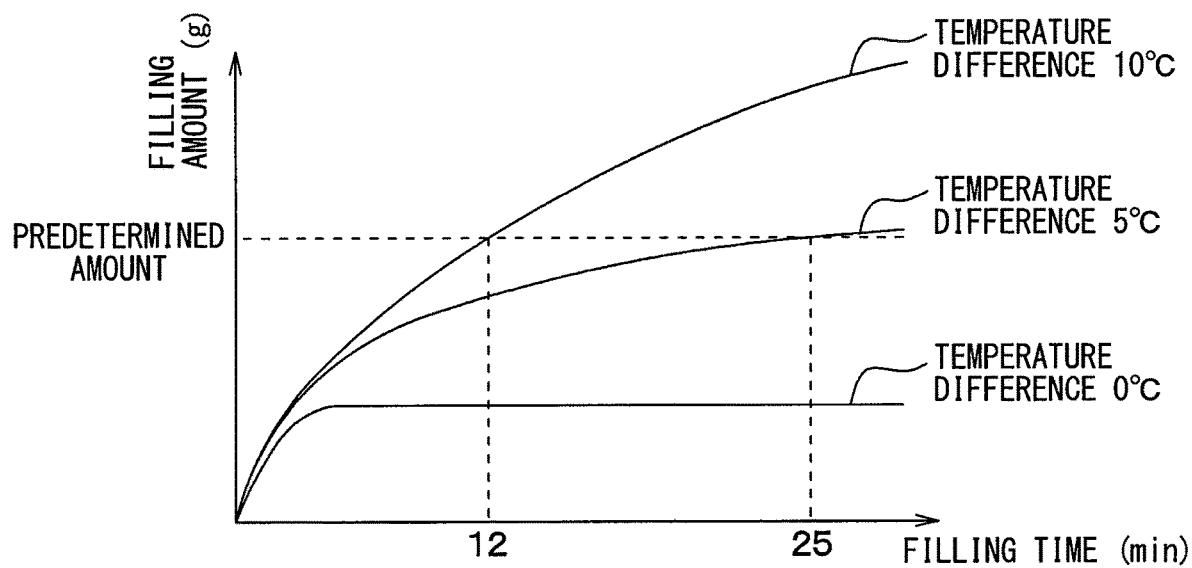
FIG. 6 is a chart showing a relationship between a refrigerant filling amount and a refrigerant filling time at each temperature difference between an inside of the device fluid circuit and an inside of the gas canister.

FIG. 6 shows a relationship between a refrigerant filling time and a refrigerant filling amount after connection between the filling port 36 and the gas canister 45 in a vacuum state of the inside of the device fluid circuit 10. According to a measurement result of the present inventor, the refrigerant filling amount does not reach the predetermined amount when the temperature difference between the inside of the device fluid circuit 10 and the inside of the gas canister 45 is 0° C. as shown in FIG. 6. In other words, when the inside of the device fluid circuit 10 is not cooled, the predetermined amount of the refrigerant cannot be filled.

However, when the inside temperature of the device fluid circuit 10 is made lower than the inside temperature of the gas canister 45 by 5° C., that is, when the temperature difference is set to 5° C., the predetermined amount of refrigerant is filled in approximately 25 minutes. Furthermore, when the inside temperature of the device fluid circuit 10 is made lower than the inside temperature of the gas canister 45 by 10° C., that is, when the temperature difference is set to 10° C., the predetermined amount of refrigerant is filled in approximately 12 minutes.

According to the present embodiment, as described above, the device temperature controller 1 includes the refrigeration cycle device 21 which is a cooling device for cooling the inside of the device fluid circuit 10. In the filling step, the refrigeration cycle device 21 is operated to produce a refrigerant having a temperature lower than the outside air temperature. The gaseous refrigerant inside the device fluid circuit 10 is cooled by using the low temperature refrigerant thus produced. When the gaseous refrigerant has a low temperature in this stage, the inside pressure of the device fluid circuit 10 becomes lower than the inside pressure of the gas canister 45 in accordance with a physical phenomenon of a saturated pressure drop of the refrigerant. The gaseous refrigerant is therefore allowed to be sucked into the device fluid circuit 10 by utilizing this pressure difference.

Moreover, according to the method for manufacturing the device temperature controller 1 of the present embodiment, the inside of the device fluid circuit 10 can be filled with a gaseous refrigerant by using a gauge manifold and a gas canister which are used when an ordinary air conditioning refrigeration cycle device is filled with a refrigerant. Accordingly, the same type of refrigerant as the type used for the air conditioning refrigeration cycle device 21 can be adopted as working fluid of the device fluid circuit 10.

Figure 7:
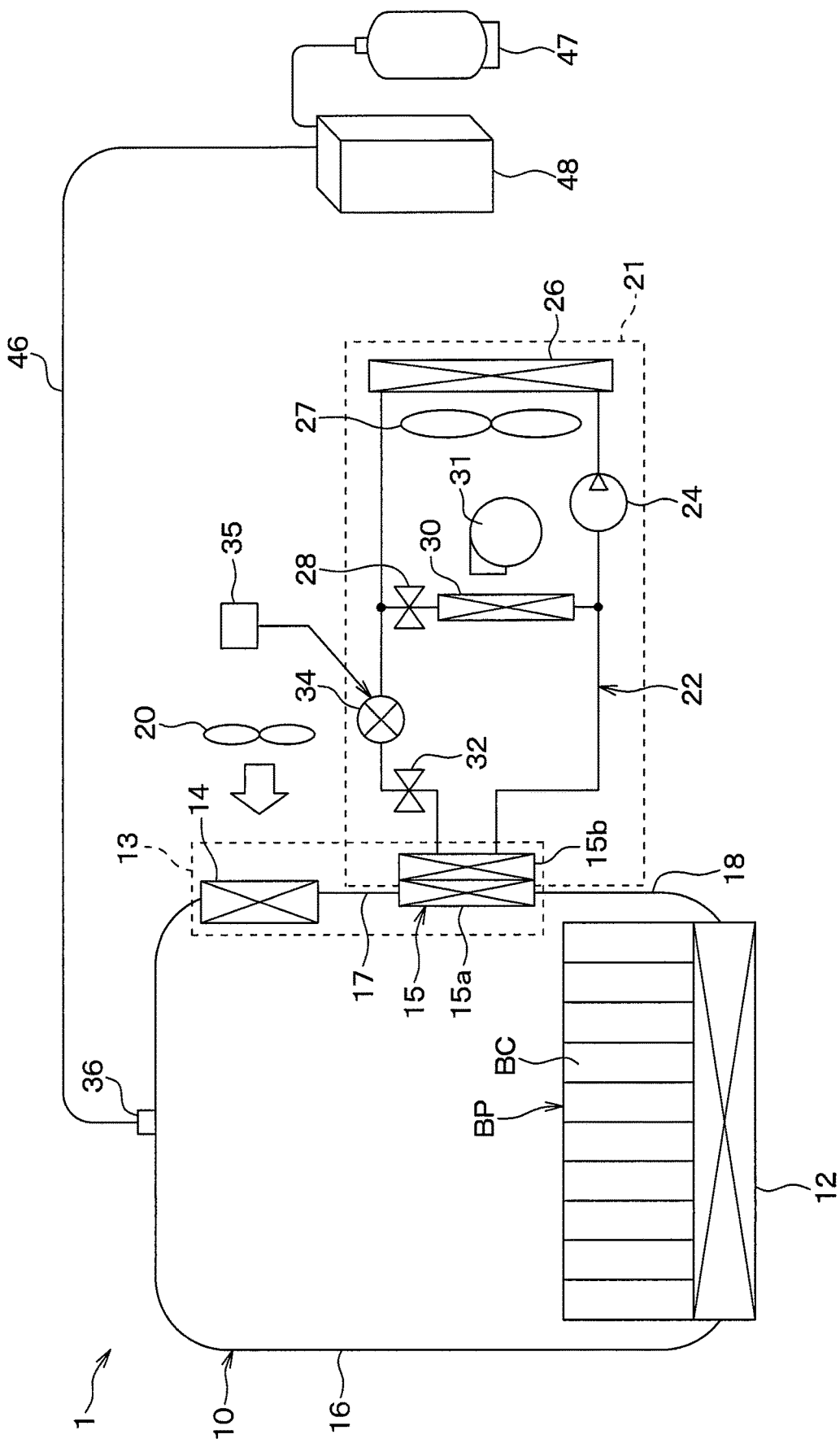
FIG. 7 is a schematic diagram of the device temperature controller in at least one embodiment in a state that a gas cylinder is connected.

According to the present embodiment, the gas canister 45 is used in the filling step. However, a gas cylinder 47 may be used in the filling step as shown in FIG. 7. The gas cylinder 47 is a container which contains a larger amount of a gaseous refrigerant than that amount of the gas canister 45. In this case, a refrigerant recovery and filling device 48 is used to suck the gaseous refrigerant into the device fluid circuit 10 while measuring the weight of the gaseous refrigerant. The refrigerant recovery and filling device 48 is an ordinary device used for refrigerant recovery and refrigerant filling of an air conditioning refrigeration cycle device in market service. According to the present embodiment, therefore, existing service infrastructures are available. Advantages of cost reduction and market service easiness can therefore be obtained.

According to the present embodiment, the same type of refrigerant as the type used for the air conditioning refrigeration cycle device 21 is adopted as working fluid. However, working fluid of a type different from the type used for the refrigeration cycle device 21 may be adopted. It is preferable that the working fluid adopted herein be fluid which becomes gas at ordinary temperature and ordinary pressure. Also in this case, filling the inside of the device fluid circuit 10 with gaseous working fluid can be achieved by a method similar to the method of the present embodiment. According to this configuration, a gas canister or a gas cylinder different from those for air conditioning is used. However, a filling device such as a gauge manifold used for filling an air conditioner with a refrigerant can be adopted only with replacement of a joint portion. Alternatively, a product similar to a filling device such as a gauge manifold used for filling an air conditioner with a refrigerant can be used.

According to the method for manufacturing the device temperature controller 1 of the present embodiment, the operator operates the dedicated switch 35 before operation of the refrigeration cycle device 21 in the filling step S2. The second refrigerant circuit is produced in response to this operation. Thereafter, the operator operates the air conditioner switch. The refrigeration cycle device 21 thus cools working fluid.

The purpose of operation of the refrigeration cycle device 21 when the battery pack BP is cooled by cooling the working fluid in the refrigeration cycle device 21 is different from the purpose of operation of the refrigeration cycle device 21 when the inside of the device fluid circuit 10 is filled with the working fluid by cooling the working fluid in the refrigeration cycle device 21. Accordingly, the dedicated switch 35 for filling the working fluid is required as in the present embodiment. The operator operates the dedicated switch 35 in the filling step S2. In response to this operation, the refrigeration cycle device 21 is allowed to operate for the purpose of filling the working fluid.

According to the present embodiment, the operator operates the dedicated switch 35 to open the on-off valve 34 in the operation method in the filling step S2. However, other methods may be adopted. For example, the operator may connect a not-shown operation unit to an operation connector of the on-off valve 34, and operate the connected operation unit. In this case, the operator operates the operation unit to close the on-off valve after completion of filling. Thereafter, the operator removes the connector of the operation unit. Alternatively, the operator may press and hold a button for a different function for a long time in another example. In this case, the button for the different function constitutes an operation unit operated by the operator for filling the working fluid.

The operation for opening the on-off valve 34 in the filling step is only allowed during a stop of the vehicle. Accordingly, the operator is allowed to perform this operation during market service. During traveling of the vehicle, a vehicle occupant is not allowed to perform this operation. Accordingly, overcooling and fuel consumption increase during traveling can be prevented.

The refrigerant is supplied to the second condenser 15 when this supply is necessary, i.e., when both the outside air temperature and the battery temperature are higher than the predetermined temperature. When this supply is unnecessary, the refrigerant is not supplied to the second condenser 15. Accordingly, overcooling of the battery during traveling of the vehicle is avoidable. Moreover, unnecessary power consumption and resultant increase in fuel consumption of the vehicle are avoidable when the compressor is an electrically operated compressor. In addition, insufficiency of air conditioning capacity is avoidable.

Second Embodiment

Figure 8:
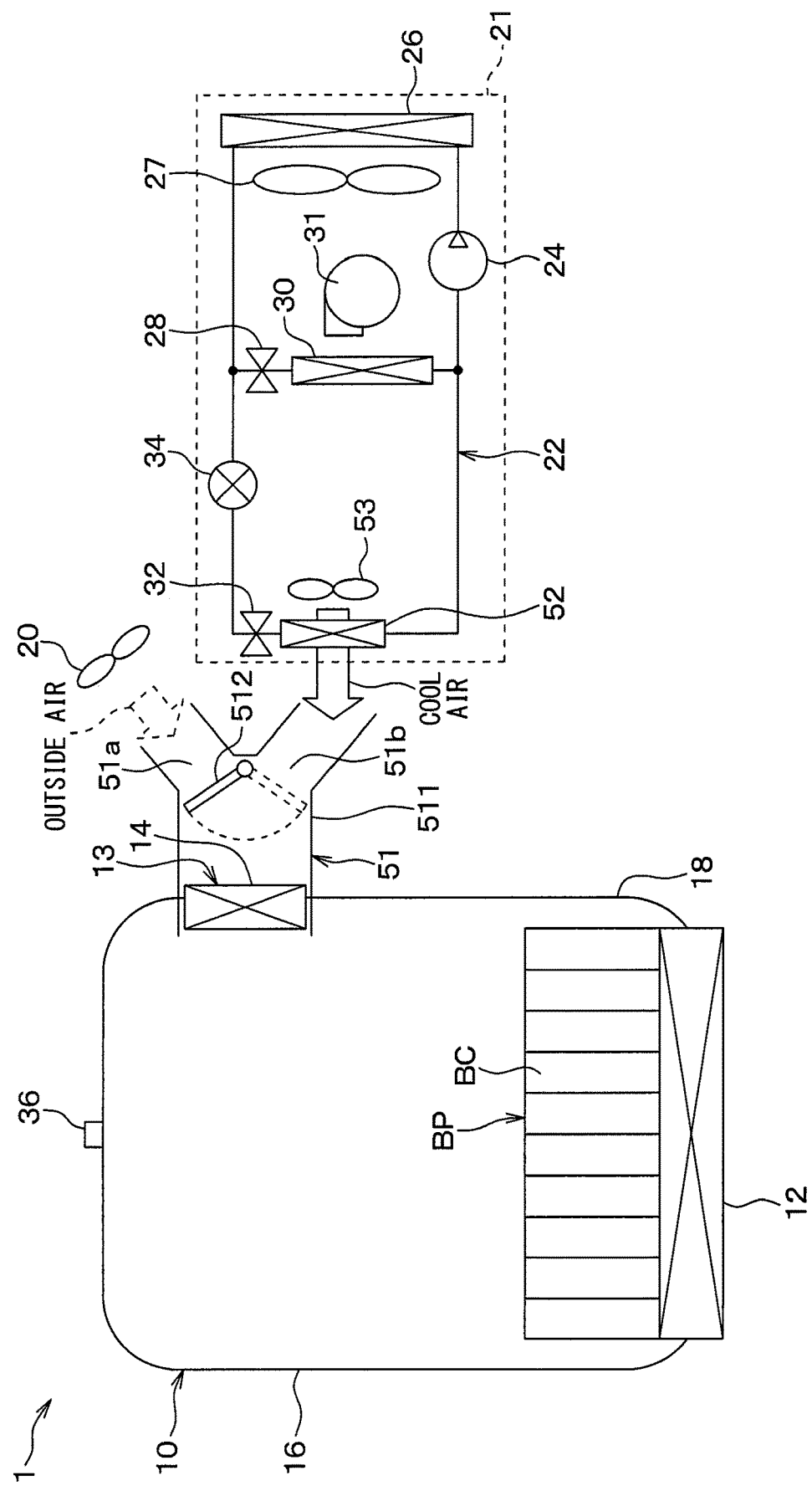
FIG. 8 is a schematic diagram showing a configuration of a device temperature controller according to at least one embodiment.

As shown in FIG. 8, the present embodiment is different from the first embodiment in that a component different from the device condensing portion 13 is adopted. Other configurations of the device temperature controller 1 are similar to the corresponding configurations of the first embodiment.

The device temperature controller 1 includes a condenser 14 of an air-cooling type which functions as the device condensing portion 13. The condenser 14 is a heat exchanger which exchanges heat between working fluid and blown air supplied to the condenser 14. The condenser 14 selectively receives, as blown air, outside air or cold air having a temperature lower than the temperature of the outside air. The cold air is produced by the refrigeration cycle device 21. The cold air is cooling air for cooling working fluid.

More specifically, the device temperature controller 1 includes a switching device 51 which selectively switches between outside air and cold air as blown air supplied to the condenser 14. The switching device 51 includes a duct 511 which contains an air flow path through which air flows, and has an outside air introduction port 51a and a cold air introduction port 51b. The switching device 51 includes a switching door 512 which selectively opens or closes the outside air introduction port 51a and the cold air introduction port 51b.

The refrigeration cycle device 21 includes a second expansion valve 32 and a cold air evaporator 52 connected in parallel to the first expansion valve 28 and the air conditioning evaporator 30 in a refrigerant flow. The cold air evaporator 52 corresponds to the refrigerant side heat exchange portion 15b of the first embodiment. The device temperature controller 1 includes a blower 53 which supplies air through the cold air evaporator 52 to the condenser 14. The cold air evaporator 52 is a heat exchanger which cools blown air by heat exchange between blow air from the blower 53 and a refrigerant from the second expansion valve 32 to produce cold air, and also evaporates the refrigerant. Other configurations of the refrigeration cycle device 21 are similar to the corresponding configurations of the first embodiment.

According to the present embodiment, the second refrigerant circuit through which a refrigerant flows in the order of the compressor 24, the air conditioning condenser 26, the second expansion valve 32, and the cold air evaporator 52 is similarly formed by opening of the on-off valve 34 of the refrigerant circuit 22 in addition to the first refrigerant circuit.

A cooling mode of the condenser 14 is set to an outside air cooling mode for cooling working fluid by outside air when the outside air temperature or the battery temperature is lower than a predetermined temperature. In this mode, the outside air introduction port 51a of the switching device 51 is opened. The blower 20 starts operation. As a result, the working fluid is cooled and condensed at the condenser 14 by heat exchange with blown air supplied from the blower 20.

The cooling mode of the condenser 14 is set to a cold air cooling mode for cooling working fluid by cold air when both the outside air temperature and the battery temperature are higher than the predetermined temperature. In this mode, the on-off valve 34 is opened. The blower 53 starts operation. The compressor 24 and the blower 27 of the refrigeration cycle device 21 also start operation. In this condition, the refrigerant flows through the second refrigerant circuit. The working fluid is cooled and condensed at the condenser 14 by heat exchange with cold air from the cold air evaporator 52.

A basic operation of the device temperature controller 1 is the same as the basic operation of the first embodiment.

A method for manufacturing the device temperature controller 1 is basically the same as the corresponding method of the first embodiment. According to the present embodiment, the inside of the device fluid circuit 10 is evacuated by a vacuum pump, and connection is switched to connection between the filling port 36 and the gas canister 45 in the filling step. Thereafter, the cold air cooling mode is executed as the cooling mode of the condenser 14. As a result, a gaseous refrigerant inside the device fluid circuit 10 is cooled at the condenser 14. The gaseous refrigerant is thus sucked into the device fluid circuit 10.

According to the present embodiment, the device temperature controller 1 includes the refrigeration cycle device 21 which is a cooling device for cooling the inside of the device fluid circuit 10. In the filling step, the refrigeration cycle device 21 is operated to produce cooling air having a temperature lower than the outside air temperature around the gas canister 45. The refrigerant inside the device fluid circuit 10 is cooled by using the cooling air thus produced. In this manner, the inside temperature of the device fluid circuit 10 is made lower than the inside temperature of the gas canister 45. According to the present embodiment, a predetermined amount of working fluid can be similarly filled for the reasons described in the first embodiment.

While the refrigeration cycle device 21 includes the cold air evaporator 52 in the present embodiment, the cold air evaporator 52 may be eliminated. In this case, a duct is provided to guide cooling air cooled by the air conditioning evaporator 30 to the condenser 14. The refrigerant inside the device fluid circuit 10 may be cooled by using the cooling air cooled by the air conditioning evaporator 30 supplied via this duct.

Third Embodiment

Figure 9:
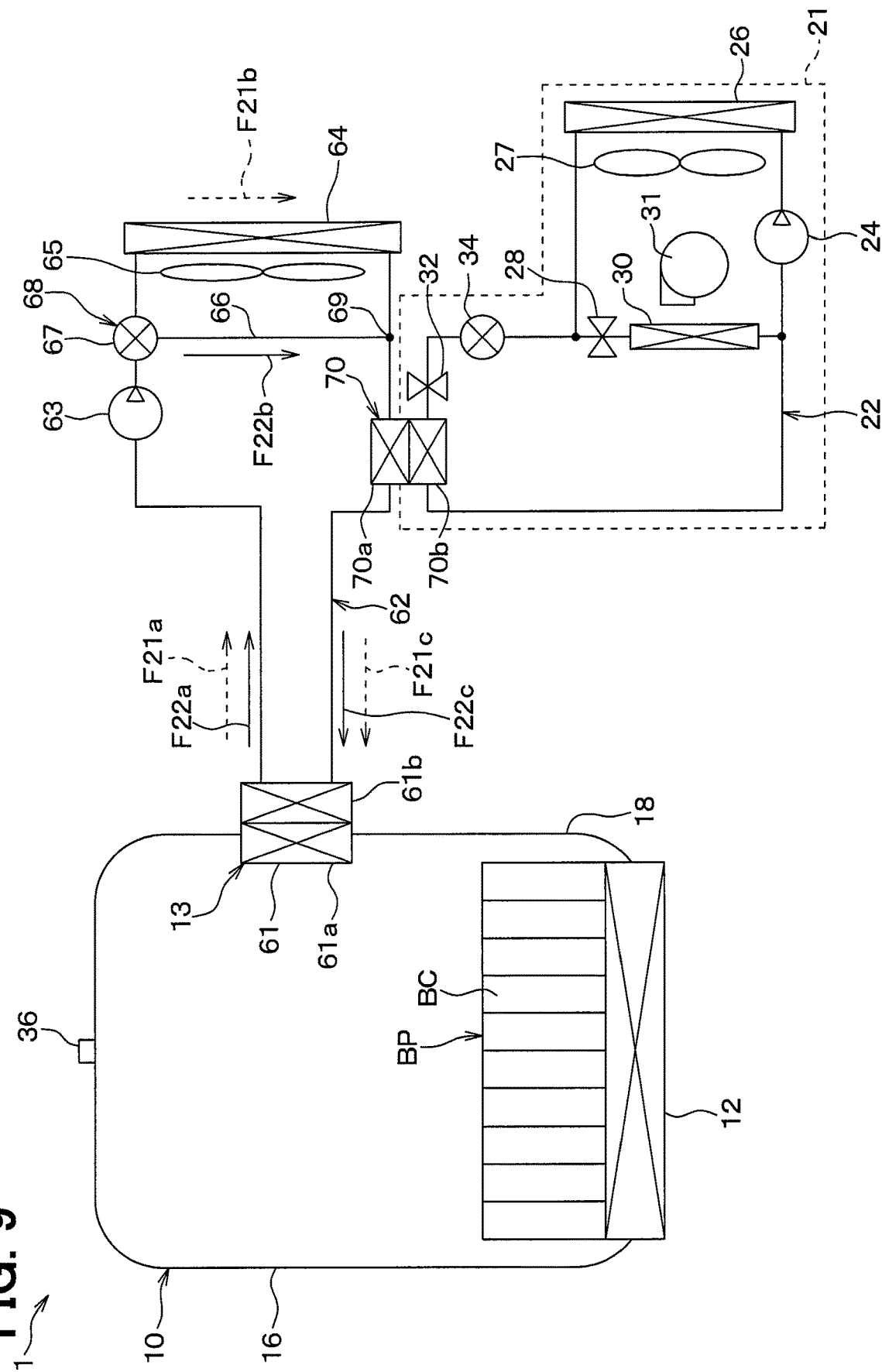
FIG. 9 is a schematic diagram showing a configuration of a device temperature controller according to at least one embodiment.

As shown in FIG. 9, the present embodiment is different from the first embodiment in that a component different from the device condensing portion 13 is adopted. Other configurations of the device temperature controller 1 are similar to the corresponding configurations of the first embodiment.

The device temperature controller 1 includes a condenser 61 of a water-cooling type which functions as the device condensing portion 13, and a cooling water circuit 62 through which cooling water circulates. Cooling water is a cooling liquid containing water. The cooling liquid is a liquid heat medium for transporting heat. For example, the cooling water is antifreeze solution or water. The condenser 61 is a heat exchanger which condenses a working medium of the device fluid circuit 10 by heat exchange with the cooling water of the cooling water circuit 62. The condenser 61 includes a working fluid side heat exchange portion 61a through which the working fluid of the device fluid circuit 10 flows, and a cooling water side heat exchange portion 61b through which the cooling water of the cooling water circuit 62 flows. The working fluid side heat exchange portion 61a and the cooling water side heat exchange portion 61b are thermally connected to each other to achieve heat exchange between the working fluid and the cooling water.

The cooling water circuit 62 is basically produced by connection between a water pump 63, a radiator 64, and the cooling water side heat exchange portion 61b. The device temperature controller 1 includes a blower 65.

The water pump 63 produces a flow of cooling water by discharging sucked cooling water. The radiator 64 is a heat exchanger which causes cooling water to release heat by heat exchange with air supplied by the blower 65, that is, the outside air. The cooling water side heat exchange portion 61b causes the cooling water to receive heat from the working fluid by heat exchange with the working fluid flowing through the working fluid side heat exchange portion 61a.

The cooling water circuit 62 further includes a bypass flow path 66 and a switching valve 67. The bypass flow path 66 is a flow path through which cooling water flows while bypassing the radiator 64. The switching valve 67 switches between a flow of cooling water flowing through the radiator 64 and a flow of cooling water flowing through the bypass flow path 66. One end of the bypass flow path 66 is connected to a branching portion 68 located on the downstream side of the water pump 63 and on the upstream side of the radiator 64. The switching valve 67 is provided at the branching portion 68. The other end of the bypass flow path 66 is connected to a junction portion 69 located on the downstream side of the radiator 64.

The cooling water circuit 62 includes a cooler 70. The cooler 70 is a heat exchanger which cools cooling water by heat exchange with the refrigerant of the refrigeration cycle device 21. The cooler 70 is connected between the junction portion 69 and the cooling water side heat exchange portion 61b.

The cooler 70 includes a cooling water side heat exchange portion 70a through which the cooling water flows, and a refrigerant side heat exchange portion 70b through which the refrigerant of the refrigerant circuit 22 flows. The cooling water side heat exchange portion 70a and the refrigerant side heat exchange portion 70b are thermally connected to achieve heat exchange between the cooling water and the refrigerant.

The refrigerant circuit 22 includes the second expansion valve 32 and the refrigerant side heat exchange portion 70b connected in parallel to the first expansion valve 28 and the air conditioning evaporator 30 in a refrigerant flow. The refrigerant side heat exchange portion 70b corresponds to the refrigerant side heat exchange portion 15b of the first embodiment. The refrigerant side heat exchange portion 70b is an evaporating portion at which a refrigerant is evaporated by heat exchange with cooling water. Other configurations of the refrigeration cycle device 21 are similar to the corresponding configurations of the first embodiment.

According to the present embodiment, the second refrigerant circuit through which a refrigerant flows in the order of the compressor 24, the air conditioning condenser 26, the second expansion valve 32, and the refrigerant side heat exchange portion 70b is similarly produced by opening the on-off valve 34 of the refrigerant circuit 22 in addition to the first refrigerant circuit.

A cooling water heat release mode is set to an outside air heat release mode for releasing heat from the cooling water to the outside air when the outside air temperature or the battery temperature is lower than a predetermined temperature. In this case, the switching valve 67 produces a state that the cooling water flows through the radiator 64. The water pump 63 and the blower 65 start operation. In this case, the refrigeration cycle device 21 is in a stopped state. The on-off valve 34 is closed when the refrigeration cycle device 21 operates for air conditioning. As a result, the cooling water circulates between the condenser 61 and the radiator 64 as indicated by arrows F21a, F21b, and F21c in FIG. 9 in the cooling water circuit 62. The working fluid is thus cooled and condensed at the condenser 61 by heat exchange with the cooling water.

The cooling water heat release mode is set to a refrigerant heat release mode for releasing heat from the cooling water to the refrigerant of the refrigeration cycle device 21 when both the outside air temperature and the battery temperature are higher than the predetermined temperature. In this case, the switching valve 67 produces a state that the cooling water flows through the bypass flow path 66. The water pump 63 starts operation. As a result, the cooling water circulates between the condenser 61 and the cooler 70 as indicated by arrows F22a, F22b, and F22c in FIG. 9 in the cooling water circuit 62. In addition, the on-off valve 34 of the refrigeration cycle device 21 is opened. The compressor 24 and the blower 27 of the refrigeration cycle device 21 start operation. In this condition, the refrigerant flows through the second refrigerant circuit. As a result, the cooling water releases heat at the cooler 70 by heat exchange with the refrigerant. Accordingly, the cooling water is cooled. The working fluid is thus cooled and condensed at the condenser 61 by heat exchange with the cooling water cooled by the cooler 70.

According to the present embodiment, as described above, the condensing portion of the device fluid circuit 10 and the evaporating portion of the refrigerant circuit 22 are thermally connected via the cooling water circuit 62.

A basic operation of the device temperature controller 1 is the same as the basic operation of the first embodiment.

A method for manufacturing the device temperature controller 1 is basically the same as the corresponding method of the first embodiment. According to the present embodiment, the inside of the device fluid circuit 10 is evacuated by a vacuum pump, and connection is switched to connection between the filling port 36 and the gas canister 45 in the filling step. Thereafter, the refrigerant heat release mode is executed as the cooling water heat release mode. As a result, the gaseous refrigerant inside the device fluid circuit 10 is cooled at the condenser 71. The gaseous refrigerant is thus sucked into the device fluid circuit 10.

According to the present embodiment, the device temperature controller 1 includes the refrigeration cycle device 21 which is a cooling device for cooling the inside of the device fluid circuit 10. In the filling step, the refrigeration cycle device 21 is operated to produce cooling water having a temperature lower than the outside air temperature around the gas canister 45. The refrigerant inside the device fluid circuit 10 is cooled by using the cooling water thus produced. In this manner, the inside temperature of the device fluid circuit 10 is made lower than the inside temperature of the gas canister 45. According to the present embodiment, a predetermined amount of working fluid can be similarly filled for the reasons described in the first embodiment.

While cooling water, that is, cooling liquid containing water, is used in the present embodiment, cooling liquid containing no water may be used.

Fourth Embodiment

Figure 10:
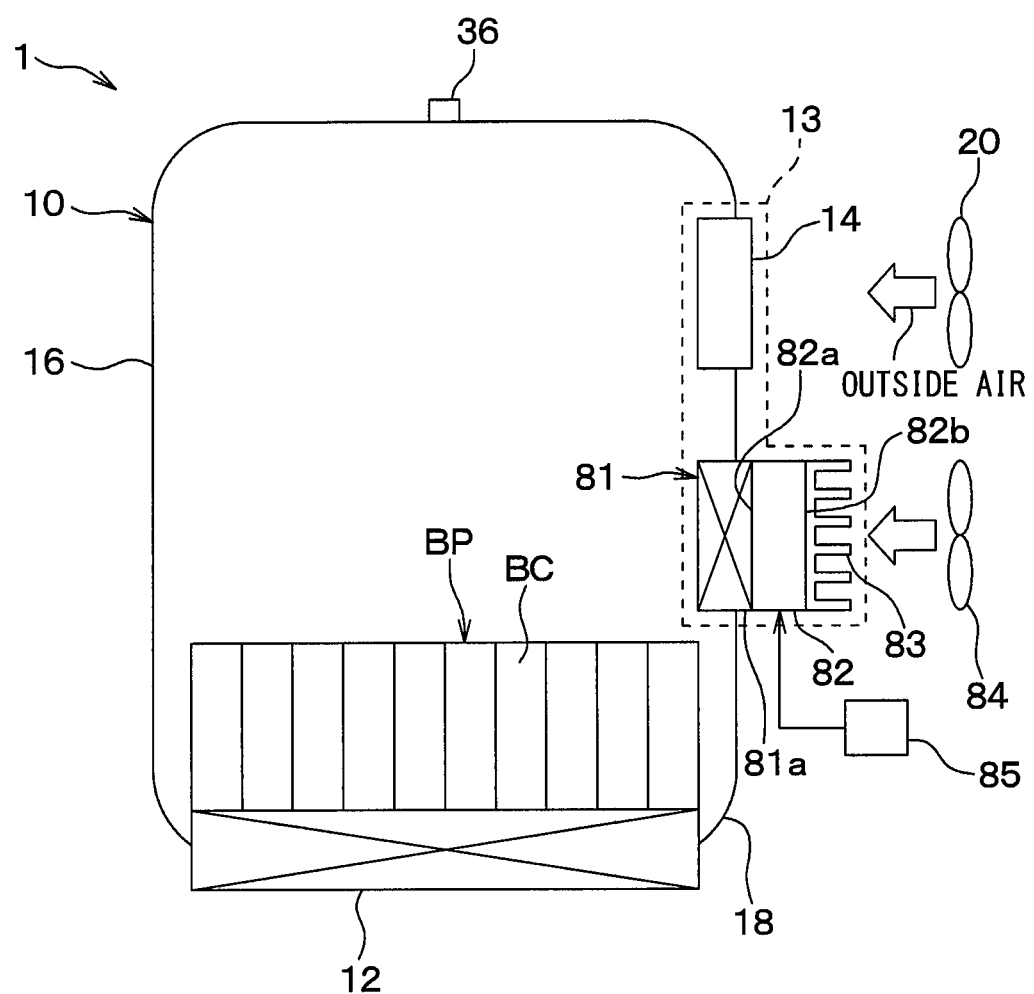
FIG. 10 is a schematic diagram showing a configuration of a device temperature controller according to at least one embodiment.

As shown in FIG. 10, the present embodiment is different from the first embodiment in that a component different from the device condensing portion 13 is adopted. Other configurations of the device temperature controller 1 are similar to the corresponding configurations of the first embodiment.

The device temperature controller 1 includes the first condenser 14 and a second condenser 81 each functioning as the device condensing portion 13. The second condenser 81 includes a working fluid side heat exchange portion 81*a* through which working fluid flows, and a Peltier element 82 which cools the working fluid. The second condenser 81 is a heat exchanger which cools and condenses working fluid flowing through the working fluid side heat exchange portion 81*a* by using the Peltier element 82.

The Peltier element 82 is a thermoelectric element which converts electric energy into thermal energy. The Peltier element 82 includes a cooling surface 82*a* and a heat radiation surface 82*b*. The cooling surface 82*a* is thermally connected to the working fluid side heat exchange portion 81*a*. Heat radiation fins 83 for promoting heat release are provided on the heat radiation surface 82*b*. The device temperature controller 1 includes a blower 84 which produces an air flow passing through the heat radiation fins 83. Heat radiation from the heat radiation fins 83 is promoted by air supplied by the blower 84.

When the outside air temperature or the battery temperature is lower than a predetermined temperature, the blower 20 starts operation. The Peltier element 82 is in a stopped state. As a result, the working fluid is cooled and condensed at the first condenser 14 by heat exchange with supplied air.

The Peltier element 82 and the blower 84 operate when both the outside air temperature and the battery temperature are higher than the predetermined temperature. As a result, the working fluid is cooled and condensed by the Peltier element 82 at the working fluid side heat exchange portion 81*a* of the second condenser 81. In this manner, the working fluid is cooled at the device condensing portion 13 by the operation of the Peltier element 82.

A basic operation of the device temperature controller 1 is the same as the basic operation of the first embodiment.

A method for manufacturing the device temperature controller 1 is basically the same as the corresponding method of the first embodiment. According to the present embodiment, the inside of the device fluid circuit 10 is evacuated by a vacuum pump, and connection is switched to connection between the filling port 36 and the gas canister 45 in the filling step S2. Thereafter, a dedicated switch 85 for operating the Peltier element 82 and the blower 84 is operated by the operator. The dedicated switch 85 is an operation unit manually operated by the operator in the filling step S2. The dedicated switch 85 is an operation unit operated when working fluid is filled. By operation of the dedicated switch 85, the Peltier element 82 and the blower 84 start operation. The gaseous refrigerant inside the device fluid circuit 10 is cooled at the second condenser 81. The gaseous refrigerant is thus sucked into the device fluid circuit 10.

According to the present embodiment, as described above, the device temperature controller 1 includes the Peltier element 82 which is a cooling device for cooling the inside of the device fluid circuit 10. The Peltier element 82 is operated to cool the refrigerant inside the device fluid circuit 10 in the filling step. In this manner, the inside temperature of the device fluid circuit 10 is made lower than the inside temperature of the gas canister 45. According to the present embodiment, a predetermined amount of working fluid can be similarly filled for the reasons described in the first embodiment.

According to the method for manufacturing the device temperature controller 1 of the present embodiment, the operator operates the dedicated switch 85 before operation of the Peltier element 82 in the filling step S2. The working fluid is cooled by the Peltier element 82 by operation of the dedicated switch 85. In this manner, the Peltier element 82 is operated to fill the working fluid by operation of the dedicated switch 85 operated by the operator in the filling step S2.

According to the present embodiment, the operator operates the dedicated switch 85 to operate the Peltier element 82 in the operation method of the filling step S2. However, other methods may be adopted. For example, the operator may press and hold a different function button for a long time. In this case, the button for the different function constitutes an operation unit operated by the operator for filling the working fluid.

Fifth Embodiment

The present embodiment is different from the first embodiment in that a cooling substance such as ice or dry ice is used as a cooling source for cooling working fluid inside the device fluid circuit 10 in the filling step.

Figure 11:
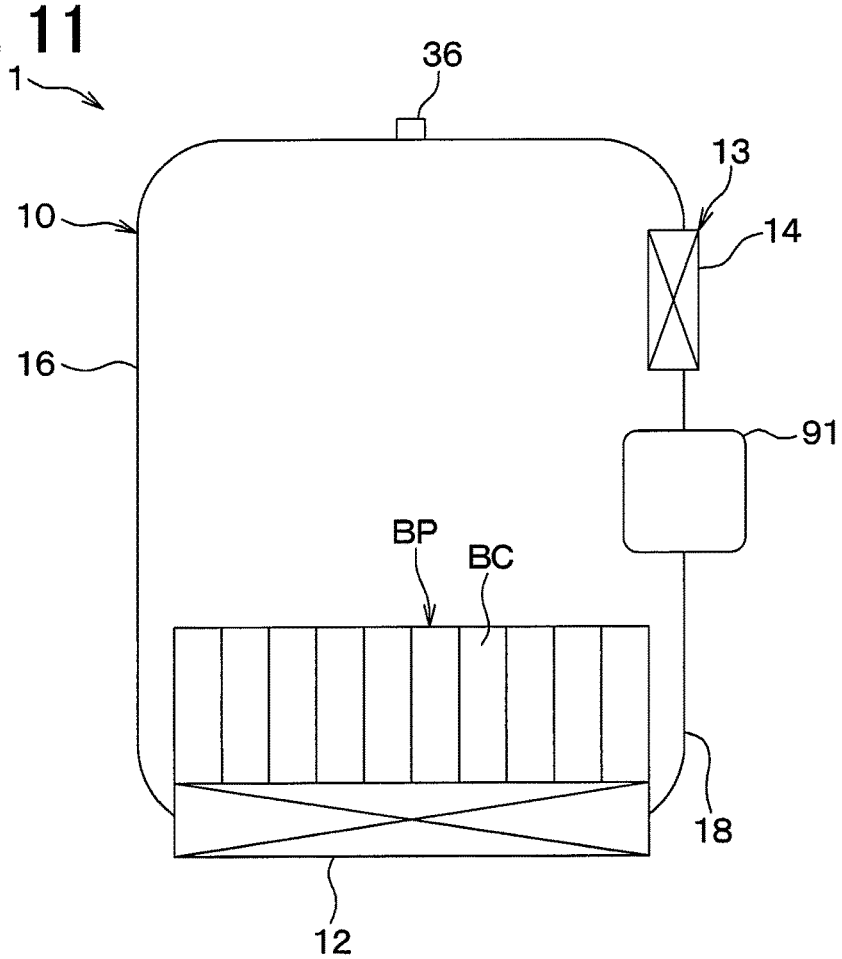
FIG. 11 is a schematic diagram showing a configuration of a device temperature controller according to at least one embodiment.

As shown in FIG. 11, the device temperature controller 1 includes a container 91 capable of storing ice or dry ice inside. The container 91 is a holding unit for holding ice or dry ice. The container 91 is provided in the liquid path portion 18.

Figure 12:
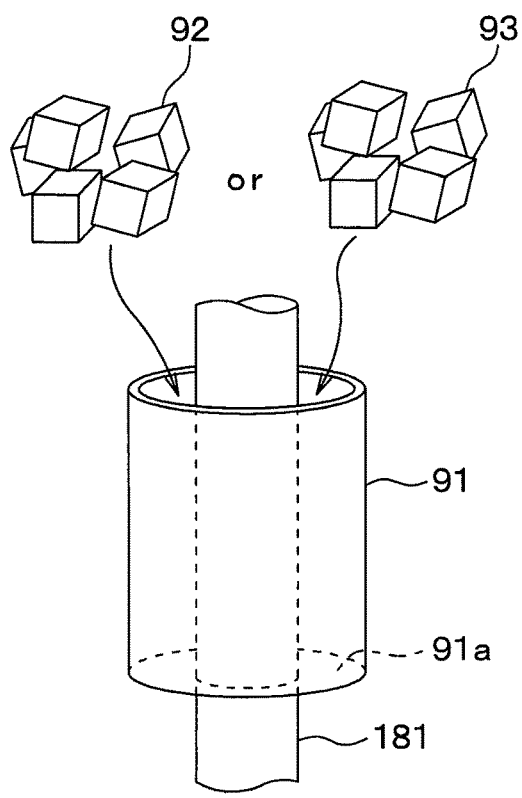
FIG. 12 is a perspective view of a container in FIG. 11.

As shown in FIG. 12, the container 91 has a cylindrical shape having a bottom portion 91*a* on one side in the axial direction. The container 91 is attached to piping 181 in such a condition that the piping 181 penetrates the bottom portion 91*a*. Accordingly, an outer surface of the piping 181 faces an internal space of the container 91. Basic configuration and basic operation of the device temperature controller 1 are the same as the basic configuration and basic operation of the first embodiment.

In addition, a method for manufacturing the device temperature controller 1 is basically the same as the corresponding method of the first embodiment. According to the present embodiment, the inside of the device fluid circuit 10 is evacuated by a vacuum pump, and connection is switched to connection between the filling port 36 and the gas canister 45 in the filling step S2. Thereafter, ice 92 or dry ice 93 is inserted into the container 91. As a result, the gaseous refrigerant inside the device fluid circuit 10 is cooled by the ice 92 or the dry ice 93. The gaseous refrigerant is thus sucked into the device fluid circuit 10.

After completion of the filling step S2, a removing step of removing the ice 92 or dry ice 93 is performed. When the ice 92 is used, the remaining ice 92 and water produced by melting of the ice 92 are removed. When the dry ice 93 is used, the remaining dry ice 93 is removed. Alternatively, when the dry ice 93 is used, the removing step is completed with sublimation of all the dry ice 93.

As described above, effects similar to the effects of the first embodiment are produced even when cooling is achieved by the cooling substance having a temperature lower than the outside air temperature in advance without using a cooling device.

Figure 13:
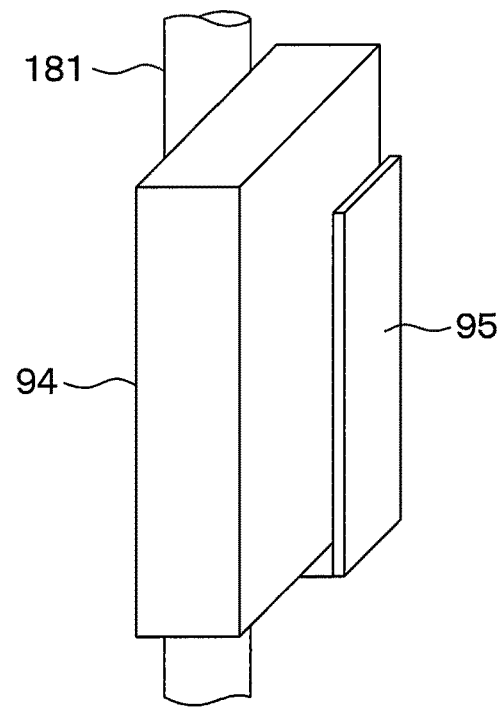
FIG. 13 is a view showing a state of attachment of a cold storage agent pack according to at least one embodiment.

While the ice 92 or the dry ice 93 is used as the cooling substance in the present embodiment, a cold storage agent pack 94 may be used as the cooling substance as shown in FIG. 13. The cold storage agent pack 94 stores a cold storage agent in a container such as a bag. The cold storage agent is generally used for food cooling and the like, and is also called a cold pack. The cold storage agent is a mixture of water, water absorbent resin (i.e., gel agent), a preservative, and others.

The device temperature controller 1 includes a holding unit 95 for holding the cold storage agent pack 94 inserted into the holding unit 95. The cold storage agent pack 94 is inserted into the holding unit 95 in the filling step. In this manner, the gaseous refrigerant inside the device fluid circuit 10 may be cooled by using the cold storage agent pack 94.

Figure 14:
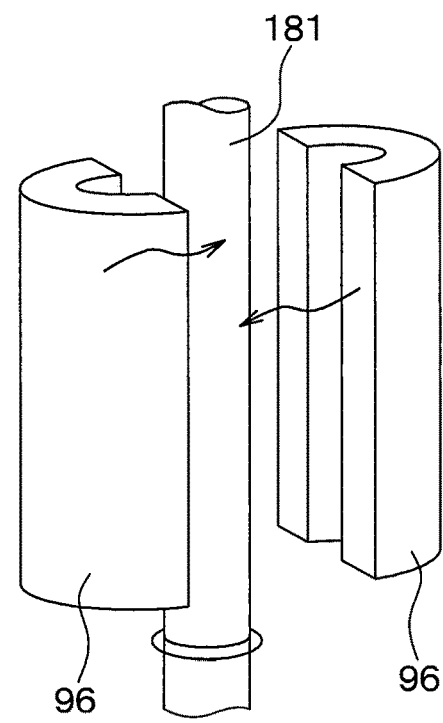
FIG. 14 is a view showing a state of attachment of cold storage agent packs according to at least one embodiment.

Alternatively, the piping 181 may be sandwiched between cold storage agent packs 96 having shapes of two divisions of a cylinder as shown in FIG. 14. In this manner, the cold storage agent packs 96 may be attached without using the holding unit 95.

Figure 15:
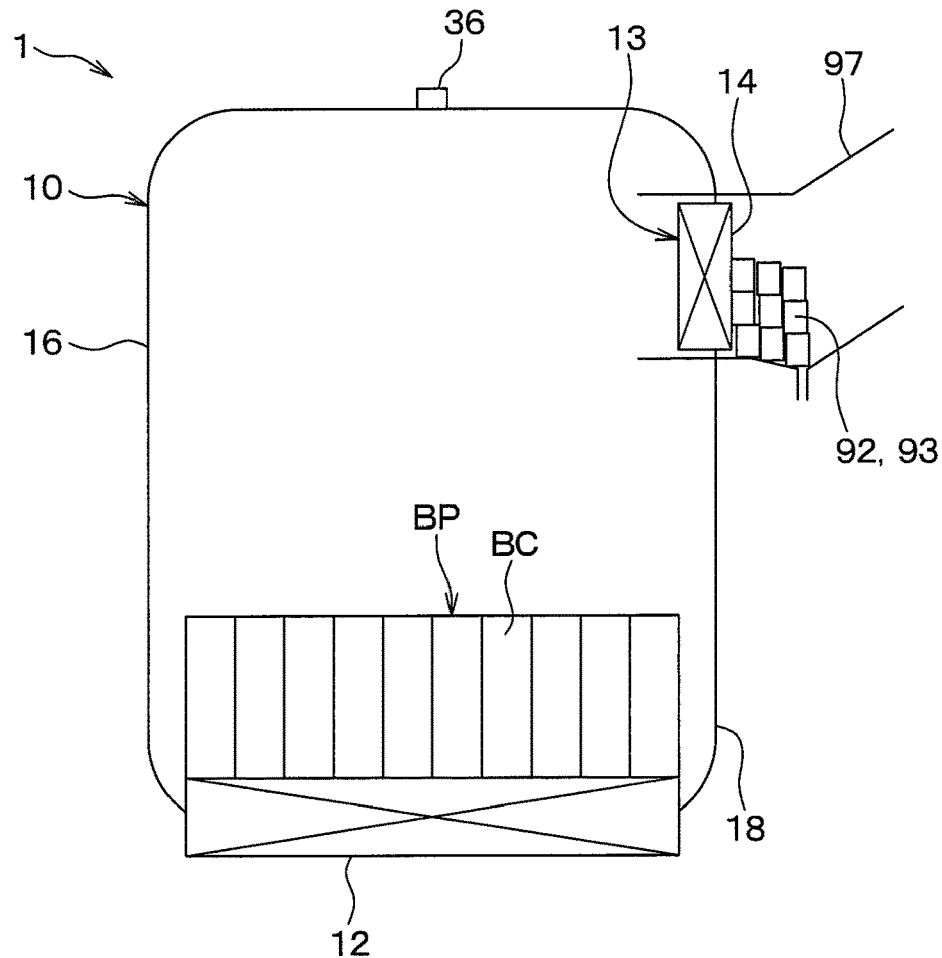
FIG. 15 is a view depicting another method for holding ice or the like in at least one embodiment.

According to the present embodiment, the ice 92 or the dry ice 93 is inserted into the dedicated container 91 which stores the ice 92 or the dry ice 93. However, other configurations may be adopted. As shown in FIG. 15, the ice 92 or the dry ice 93 may be inserted into a duct 97 constituting a path for air flowing through the condenser 14 of air-cooling type in the filling step. In this case, the ice 92 or the dry ice 93 preferably comes into contact with the condenser 14. A cold storage agent may be disposed inside the duct 97.

Figure 16:
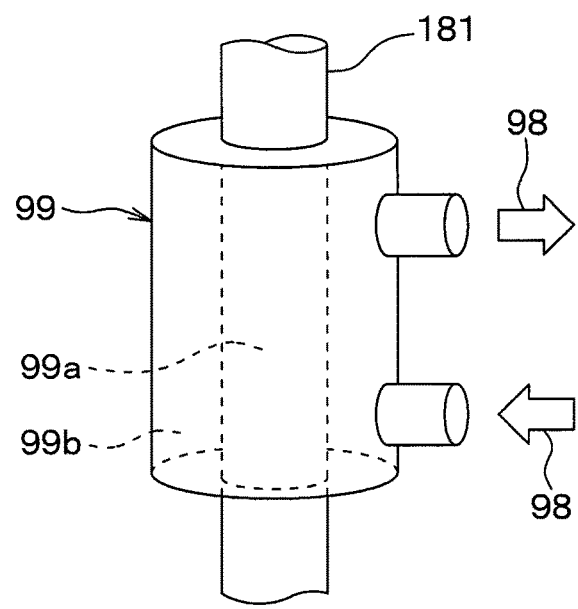
FIG. 16 is a diagram depicting a structure for cooling working fluid by cooling water in at least one embodiment.

Moreover, as shown in FIG. 16, cooling water 98 may be used as the cooling substance having a temperature lower than the outside air in advance to cool the gaseous refrigerant inside the device fluid circuit 10. More specifically, as shown in FIG. 16, a part of the piping 181 is constituted by a double pipe 99. The double pipe 99 has an inner pipe 99a through which working fluid flows, and an outer pipe 99b through which cooling water flows. Cooling water 98 having a temperature lower than the outside air temperature flows through the outer pipe 99b in the filling step.

OTHER EMBODIMENTS (1) According to the first embodiment, the operator operates the dedicated switch 35 for opening the on-off valve 34 and operates the air conditioner switch to cool the working fluid by using the refrigeration cycle device 21 in the filling step S2. However, in filling the working fluid, the operator may operate a dedicated switch for operating the compressor instead of the air-conditioner switch. The dedicated switch for operating the compressor is an operation unit for filling the working fluid.

Figure 17:
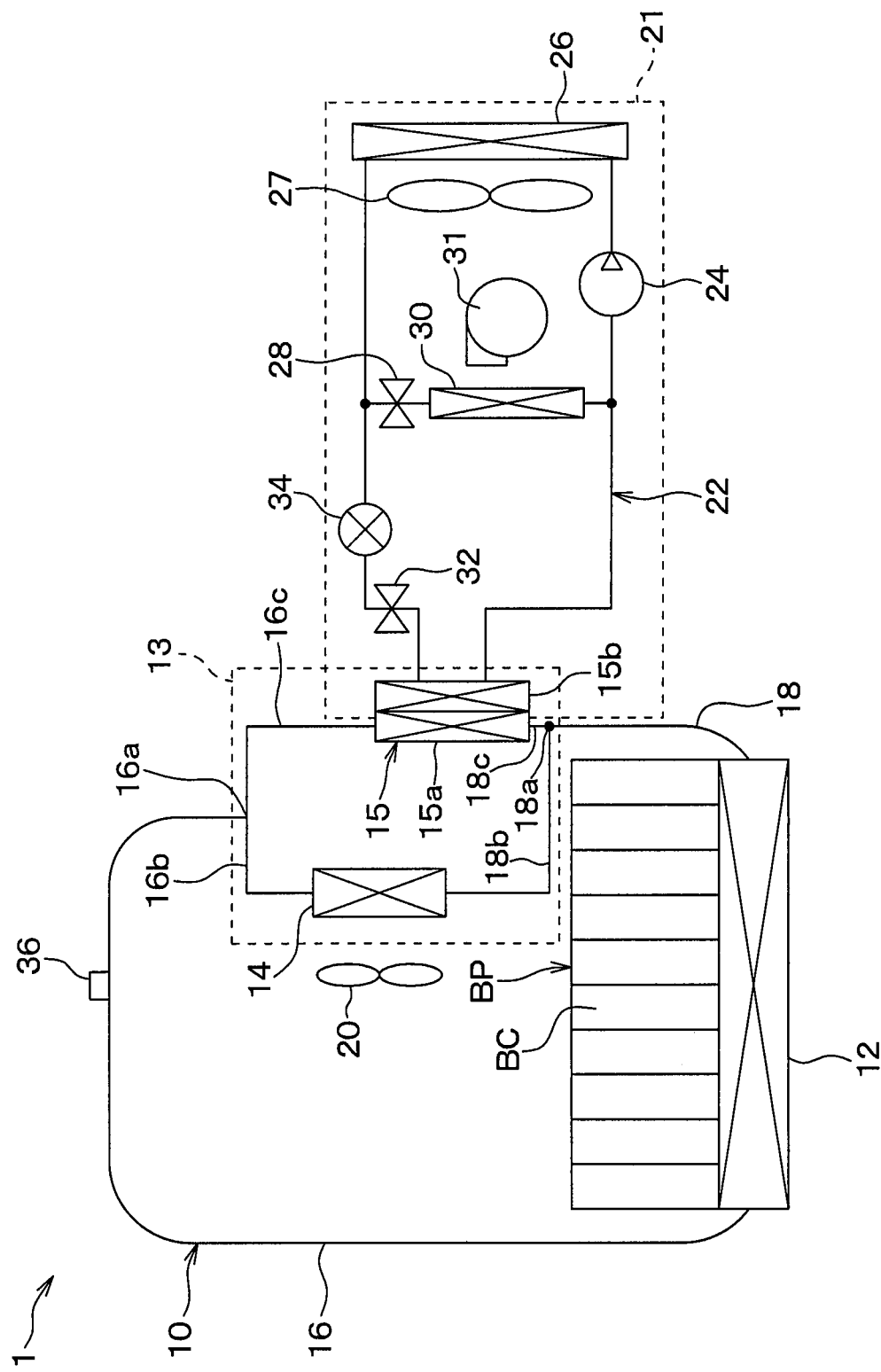
FIG. 17 is a schematic diagram showing a configuration of a device temperature controller according to at least one embodiment.

(2) According to the first embodiment, the first condenser 14 and the second condenser 15 constituting the device condensing portion 13 are disposed in series in the working fluid flow. However, other configurations may be adopted. As shown in FIG. 17, the first condenser 14 and the second condenser 15 may be disposed in parallel in the working fluid flow.

The gas path portion 16 of the device fluid circuit 10 shown in FIG. 17 includes a branching portion 16a, and two path portions 16b and 16c continuing to the branching portion 16a on the device condensing portion 13 side. The path portion 16b constituting one of the two path portions of the gas path portion 16 is connected to the first condenser 14. The path portion 16c constituting the other of the two path portions of the gas path portion 16 is connected to the second condenser 15.

The liquid path portion 18 includes a branching portion 18a, and two path portions 18b and 18c continuing to the branching portion 18a on the device condensing portion 13 side. The path portion 18b constituting one of the two path portions of the liquid path portion 18 is connected to the first condenser 14. The path portion 18c constituting the other of the two path portions of the liquid path portion 18 is connected to the second condenser 15.

Also in this case, the working fluid is cooled by at least one of the first condenser 14 and the second condenser 15 in accordance with the outside air temperature and the battery temperature similarly to the first embodiment. When the working fluid is cooled by either the first condenser 14 or the second condenser 15, saturation pressure of the working fluid lowers. In this case, the inside pressure of one of the condensers becomes lower than the inside pressure of the other condenser. Accordingly, the working fluid flowing through the gas path portion 16 preferentially flows in either the first condenser 14 or the second condenser 15, i.e., the condenser where the working fluid is cooled to have a lower temperature.

Similarly, according to a tenth embodiment, the first condenser 14 and the second condenser 81 constituting the device condensing portion 13 are disposed in series in the working fluid flow. However, other configurations may be adopted. While specific illustration is not given in the figures, the first condenser 14 and the second condenser 81 may be disposed in parallel in the working fluid flow.

(3) According to the first embodiment, the refrigerant side heat exchange portion 15b of the second condenser 15 is connected in parallel to the air conditioning evaporator 30 in the refrigeration cycle device 21. However, other configurations may be adopted. The refrigerant side heat exchange portion 15b of the second condenser 15 may be connected in series on the downstream side of the air conditioning evaporator 30 in the refrigerant flow.

Similarly, according to the second embodiment, the cold air evaporator 52 is connected in parallel to the air conditioning evaporator 30 in the refrigeration cycle device 21. However, other configurations may be adopted. The cold air evaporator 52 may be connected in series to the downstream side of the air conditioning evaporator 30 in the refrigerant flow.

Similarly, according to the third embodiment, the refrigerant side heat exchange portion 70b of the cooler 70 is connected in parallel to the air conditioning evaporator 30 in the refrigeration cycle device 21. However, other configurations may be adopted. The refrigerant side heat exchange portion 70b of the cooler 70 may be connected in series on the downstream side of the air conditioning evaporator 30 in the refrigerant flow.

(4) According to the first to third embodiments, the refrigeration cycle device 21 is provided as a common device for the device temperature controller 1 and the vehicle air conditioner. However, other configurations may be adopted. A dedicated refrigeration cycle device for the device temperature controller 1 may be provided.

(5) According to the respective embodiments described above, the device heat exchanger 12 has only the cooling function of cooling the battery pack BP. However, the device heat exchanger 12 may have a heating function of heating the battery in addition to the cooling function. More specifically, the device temperature controller 1 may control the battery temperature of the battery pack BP by cooling or heating the battery pack BP.

(6) According to the respective embodiments described above, the cooling target of the device temperature controller 1 is the battery. However, other configurations may be adopted. The cooling target may be an electronic device mounted on the vehicle other than the battery. Moreover, the cooling target is not limited to the electronic device mounted on the vehicle. The cooling target may be an electronic device installed at a place other than the vehicle.

(7) According to the respective embodiments described above, the device fluid circuit 10 is of a loop type where the flow path through which a gaseous working fluid flows and the flow path through which a liquid working fluid flows are separated from each other. However, the device fluid circuit 10 may be of a type other than the loop type.

(8) The present disclosure is not limited to the embodiments described herein, but may be appropriately modified within the scope specified in the appended claims, and also includes various modified examples and modifications within an equivalent scope. The respective embodiments described herein are not embodiments unrelated to each other, and therefore may be appropriately combined, unless obviously difficult to combine. Needless to say, elements constituting the respective embodiments described herein are not necessarily essential unless clearly expressed as particularly essential, or considered as obviously essential in principle, for example. Values such as numbers of the constituent elements, numerical values, quantities, and ranges in the respective embodiment are not limited to the specific values described herein unless clearly expressed as particularly essential, or considered as obviously limited to the specific values in principle, for example. The materials, shapes, positional relationships or other conditions of the constituent elements and the like described in the respective embodiment are not limited to specific materials, shapes, positional relationships or other conditions unless clearly expressed, or limited to the specific materials, shapes, positional relationships or other conditions in principle.

CONCLUSION

According to a first aspect shown in part or all of the above embodiments, a method for manufacturing a device temperature controller includes filling working fluid into a circuit constituting a thermosiphon type heat pipe. In the filling, an inside temperature of the circuit is made lower than an inside temperature of a container by cooling the working fluid inside the circuit using a cooling source to make an inside pressure of the circuit lower than an inside pressure of the container.

According to this method, the gas phase working fluid inside the container can be introduced into the circuit by utilizing a pressure difference between the inside of the circuit and the inside of the container. Accordingly, the device temperature controller can be easily and safely filled with the gas phase working fluid after assembly of each component of the device temperature controller.

According to a second aspect, the working fluid is cooled by operation of a cooling device in the condensing portion. In the filling, the working fluid is cooled by operating the cooling device functioning as the cooling source. In this manner, the cooling device can be used as the cooling source.

According to a third aspect, an operator operates an operation unit for filling the working fluid before the cooling device is operated. The purpose of operation of the cooling device when the cooling device cools the working fluid to cool the device is different from the purpose of operation of the cooling device when the cooling device cools the working fluid to fill the working fluid. Accordingly, as in the third aspect, the working fluid can be cooled, for the purpose of filling the working fluid, by using the cooling device in accordance with operation of the operation unit by the operator to fill the working fluid.

According to a fourth aspect, the cooling device is a refrigeration cycle device. In this manner, the refrigeration cycle device can be used as the cooling device.

According to a fifth aspect, in the filling, a cooling substance that has a temperature lower than an outside air temperature around the container in advance is used as the cooling source. In this manner, the cooling substance can be used as the cooling source.

According to a sixth aspect, a method for filling working fluid includes filling working fluid into a circuit constituting a thermosiphon type heat pipe. In the filling, an inside temperature of the circuit is made lower than an inside temperature of a container by cooling the working fluid inside the circuit using a cooling source to make an inside pressure of the circuit lower than an inside pressure of the container.

According to this method, the gas phase working fluid inside the container can be introduced into the circuit by utilizing a pressure difference between the inside of the circuit and the inside of the container. Accordingly, the device temperature controller can be easily and safely filled with the gas phase working fluid.

According to a seventh aspect, the working fluid is cooled by operation of a cooling device in the condensing portion In the filling, the working fluid is cooled by operating the cooling device functioning as the cooling source. In this manner, the cooling device can be used as the cooling source.

According to an eighth aspect, in the filling, an operator operates an operation unit for filling the working fluid before the cooling device is operated. The purpose of operation of the cooling device when the cooling device cools the working fluid to cool the device is different from the purpose of operation of the cooling device when the cooling device cools the working fluid to fill the working fluid. Accordingly, as in the third aspect, the working fluid can be cooled, for the purpose of filling the working fluid, by using the cooling device in accordance with operation of the operation unit by the operator to fill the working fluid.

According to a ninth aspect, the cooling device is a refrigeration cycle device. In this manner, the refrigeration cycle device can be used as the cooling device.

According to a tenth aspect, in the filling, a cooling substance that has a temperature lower than an outside air temperature around the container in advance is used as the cooling source. In this manner, the cooling substance can be used as the cooling source.

What is claimed is:

1. A method for manufacturing a device temperature controller that includes a circuit constituting a thermosiphon type heat pipe and allowing working fluid to circulate in the circuit, the circuit including
an evaporating portion configured to evaporate the working fluid by heat absorbed from a device,
a condensing portion configured to cool and condense the working fluid evaporated in the evaporating portion, and a filling port through which the working fluid is supplied into the circuit, the method comprising:

introducing gas phase working fluid into an inside of the circuit by connecting the filling port to a container that stores the gas phase working fluid such that the inside of the circuit is filled with the gas phase working fluid, wherein the condensing portion is configured to cool the working fluid by a refrigerant of a refrigeration cycle device for air conditioning without using conditioned air that is cooled by the refrigerant and flows toward a passenger compartment, and the introducing includes cooling the working fluid inside the circuit by the refrigerant of the refrigeration cycle device such that an inside temperature of the circuit becomes lower than an inside temperature of the container, and thereby an inside pressure of the circuit becomes lower than an inside pressure of the container.

2. The method for manufacturing a device temperature controller according to claim 1, wherein the introducing includes cooling the working fluid inside the circuit by actuating the refrigeration cycle device in a condition where an air conditioning function of the refrigeration cycle device is stopped.

3. The method for manufacturing a device temperature controller according to claim 1, wherein in the introducing, an operator performs a specific operation to an operation unit to fill the working fluid before actuating the refrigeration cycle device.

4. A method for filling an inside of a circuit of a device temperature controller with working fluid, the circuit constituting a thermosiphon type heat pipe and allowing the working fluid to circulate in the circuit, the circuit including an evaporating portion configured to evaporate the working fluid by heat absorbed from a device, a condensing portion configured to cool and condense the working fluid evaporated in the evaporating portion, and a filling port through which the working fluid is supplied into the circuit, the method comprising:

introducing gas phase working fluid into the inside of the circuit by connecting the filling port to a container that stores the gas phase working fluid such that the inside of the circuit is filled with the gas phase working fluid, wherein the condensing portion is configured to cool the working fluid by a refrigerant of a refrigeration cycle device for air conditioning without using conditioned air that is cooled by the refrigerant and flows toward a passenger compartment, and the introducing includes cooling the working fluid inside the circuit by the refrigerant of the refrigeration cycle device such that an inside temperature of the circuit becomes lower than an inside temperature of the container, and thereby an inside pressure of the circuit becomes lower than an inside pressure of the container.

5. The method for filling working fluid according to claim 4, wherein the introducing includes cooling the working fluid inside the circuit by actuating the refrigeration cycle device in a condition where an air conditioning function of the refrigeration cycle is stopped.

6. The method for filling working fluid according to claim 4, wherein in the introducing, an operator performs a specific operation to an operation unit to fill the working fluid before actuating the refrigeration cycle device.

7. A method for manufacturing a device temperature controller that includes a circuit constituting a thermosiphon type heat pipe and allowing working fluid to circulate in the circuit, the circuit including an evaporator configured to evaporate the working fluid by heat absorbed from a device, a condenser configured to cool and condense the working fluid evaporated in the evaporator, and a filling port through which the working fluid is supplied into the circuit, the method comprising:

introducing gas phase working fluid into an inside of the circuit by connecting the filling port to a container that stores the gas phase working fluid such that the inside of the circuit is filled with the gas phase working fluid, wherein the condenser is configured to cool the working fluid by a refrigerant of a refrigeration cycle device for air conditioning without using conditioned air that is cooled by the refrigerant and flows toward a passenger compartment, and the introducing includes cooling the working fluid inside the circuit by the refrigerant of the refrigeration cycle device such that an inside temperature of the circuit becomes lower than an inside temperature of the container, and thereby an inside pressure of the circuit becomes lower than an inside pressure of the container.

* * * * *